US012349604B2

(12) United States Patent
George et al.

(10) Patent No.: US 12,349,604 B2
(45) Date of Patent: Jul. 1, 2025

(54) TECHNOLOGIES FOR RADIO FREQUENCY OPTIMIZED INTERCONNECTS FOR A QUANTUM PROCESSOR

(71) Applicant: Intel Corporation, Santa Clara, CA (US)

(72) Inventors: Hubert C. George, Highlands Ranch, CO (US); Ravi Pillarisetty, Portland, OR (US); Jongseok Park, Hillsboro, OR (US); Stefano Pellerano, Beaverton, OR (US); Lester F. Lampert, Portland, OR (US); Thomas F. Watson, Portland, OR (US); Florian Luethi, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 595 days.

(21) Appl. No.: 17/561,439

(22) Filed: Dec. 23, 2021

(65) Prior Publication Data

US 2023/0210023 A1 Jun. 29, 2023

(51) Int. Cl.
*H10N 60/10* (2023.01)
*G06N 10/80* (2022.01)
(Continued)

(52) U.S. Cl.
CPC ............ *H10N 69/00* (2023.02); *G06N 10/80* (2022.01); *H01P 3/003* (2013.01); *H03H 7/38* (2013.01);
(Continued)

(58) Field of Classification Search
CPC ........ H10N 69/00; H10N 60/01; H10N 60/81; H10N 60/128; H10N 60/11; G06N 10/80;
(Continued)

(56) References Cited

U.S. PATENT DOCUMENTS

| 2016/0099699 A1 | 4/2016 | Bakalski |
| 2018/0102470 A1* | 4/2018 | Das ..................... H01L 23/5384 |

(Continued)

OTHER PUBLICATIONS

"Coplanar Waveguide," Microwaves101, 2022; accessed Apr. 12, 2022; https://www.microwaves101.com/encyclopedias/coplanar-waveguide; 2 pages.
(Continued)

*Primary Examiner* — Jami Valentine Miller
*Assistant Examiner* — Ashley Nicole Blackwell
(74) *Attorney, Agent, or Firm* — Alliance IP, LLC

(57) ABSTRACT

Technologies for radiofrequency optimized interconnects for a quantum processor are disclosed. In the illustrative embodiment, signals are carried in coplanar waveguides on a surface of a quantum processor die. A ground ring surrounds the signals and is connected to the ground conductors of each coplanar waveguide. Wire bonds connect the ground ring to a ground of a circuit board. The wire bonds provide both an electrical connection from the quantum processor die to the circuit board as well as increased thermal coupling between the quantum processor die and the circuit board, increasing cooling of the quantum processor die.

25 Claims, 15 Drawing Sheets

(51) Int. Cl.
*H01P 3/00* (2006.01)
*H03H 7/38* (2006.01)
*H10N 60/01* (2023.01)
*H10N 60/81* (2023.01)
*H10N 69/00* (2023.01)
*H01L 23/00* (2006.01)
*H05K 1/18* (2006.01)

(52) U.S. Cl.
CPC .......... *H10N 60/01* (2023.02); *H10N 60/11* (2023.02); *H10N 60/128* (2023.02); *H10N 60/81* (2023.02); *H01L 24/45* (2013.01); *H01L 24/48* (2013.01); *H01L 2224/45144* (2013.01); *H01L 2224/45147* (2013.01); *H01L 2224/45186* (2013.01); *H01L 2224/48153* (2013.01); *H01L 2224/48225* (2013.01); *H01L 2224/49171* (2013.01); *H01L 2924/0495* (2013.01); *H05K 1/18* (2013.01); *H05K 2201/10045* (2013.01); *H05K 2201/10522* (2013.01)

(58) Field of Classification Search
CPC ........ G06N 3/063; G06N 10/40; H01P 3/003; H03H 7/38; H01L 24/45; H01L 24/48; H01L 2224/45144; H01L 2224/45147; H01L 2224/45186; H01L 2224/48153; H01L 2224/48225; H01L 2224/49171; H01L 2924/0495; H01L 24/49; H05K 1/18; H05K 2201/10045; H05K 2201/10522; H05K 1/0243; H05K 1/0218; H05K 2203/049
USPC ........................................................ 257/39
See application file for complete search history.

(56) References Cited

U.S. PATENT DOCUMENTS

| 2018/0232653 A1* | 8/2018 | Selvanayagam ........ H01P 5/028 |
| 2019/0043919 A1* | 2/2019 | George .................. G06N 10/00 |
| 2019/0147359 A1 | 5/2019 | Chen et al. |
| 2019/0267692 A1 | 8/2019 | Roberts et al. |
| 2019/0305038 A1* | 10/2019 | Michalak ........... H10N 60/0156 |
| 2020/0119251 A1* | 4/2020 | Yohannes ............... H01L 24/06 |

OTHER PUBLICATIONS

Steer, Michael, "Microwave and RF Design II—Transmission Lines," North Carolina State University; LibreTexts; Dec. 9, 2021; https://eng.libretexts.org/@go/page/41029; 289 pages.

* cited by examiner

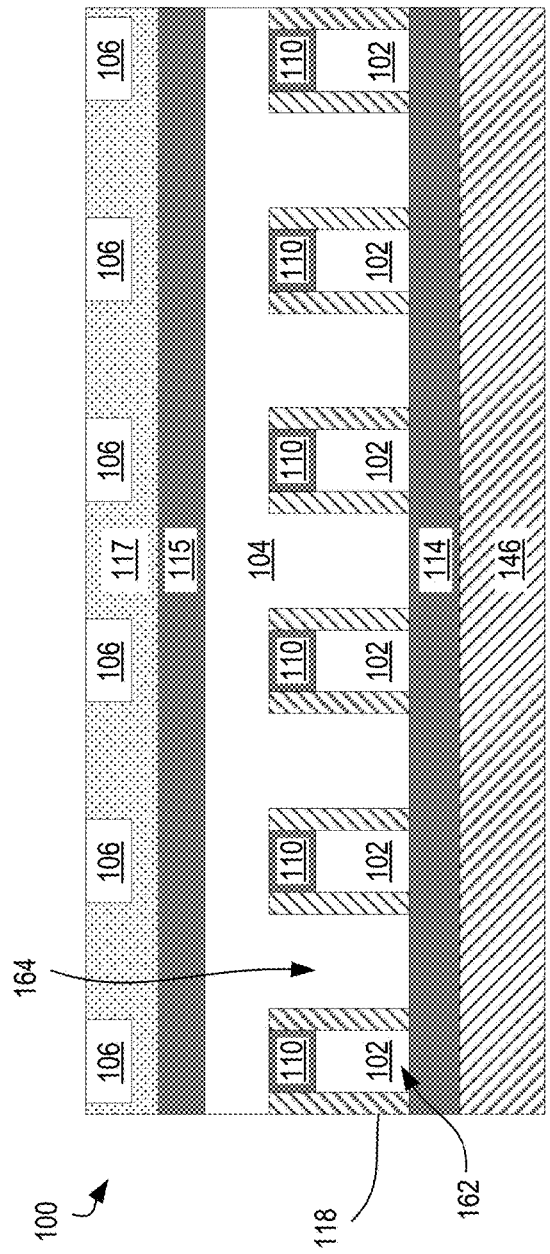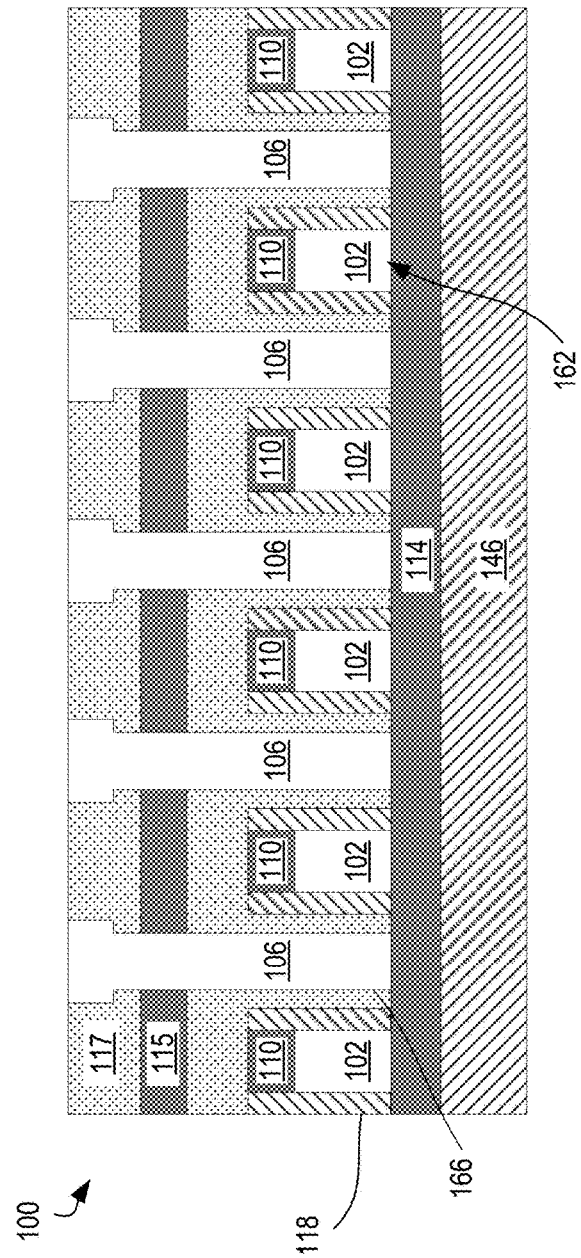
FIG. 1D
FIG. 1E

TECHNOLOGIES FOR RADIO FREQUENCY OPTIMIZED INTERCONNECTS FOR A QUANTUM PROCESSOR

BACKGROUND

Quantum computers promise computational abilities not feasible with classical computing. One of many challenges in quantum computing is transmitting and receiving a large number of high-frequency signals to and from qubits of the quantum processor. Microstrips are a relatively simple approach for transmitting and receiving signals to and from a quantum processor, but microstrips typically require a grounded substrate below the qubits, which can lead to signal loss and heating.

BRIEF DESCRIPTION OF THE DRAWINGS

FIGS. 1A-1F illustrate various views of an example quantum compute device, in accordance with one embodiment.

DETAILED DESCRIPTION

Figure 1A:
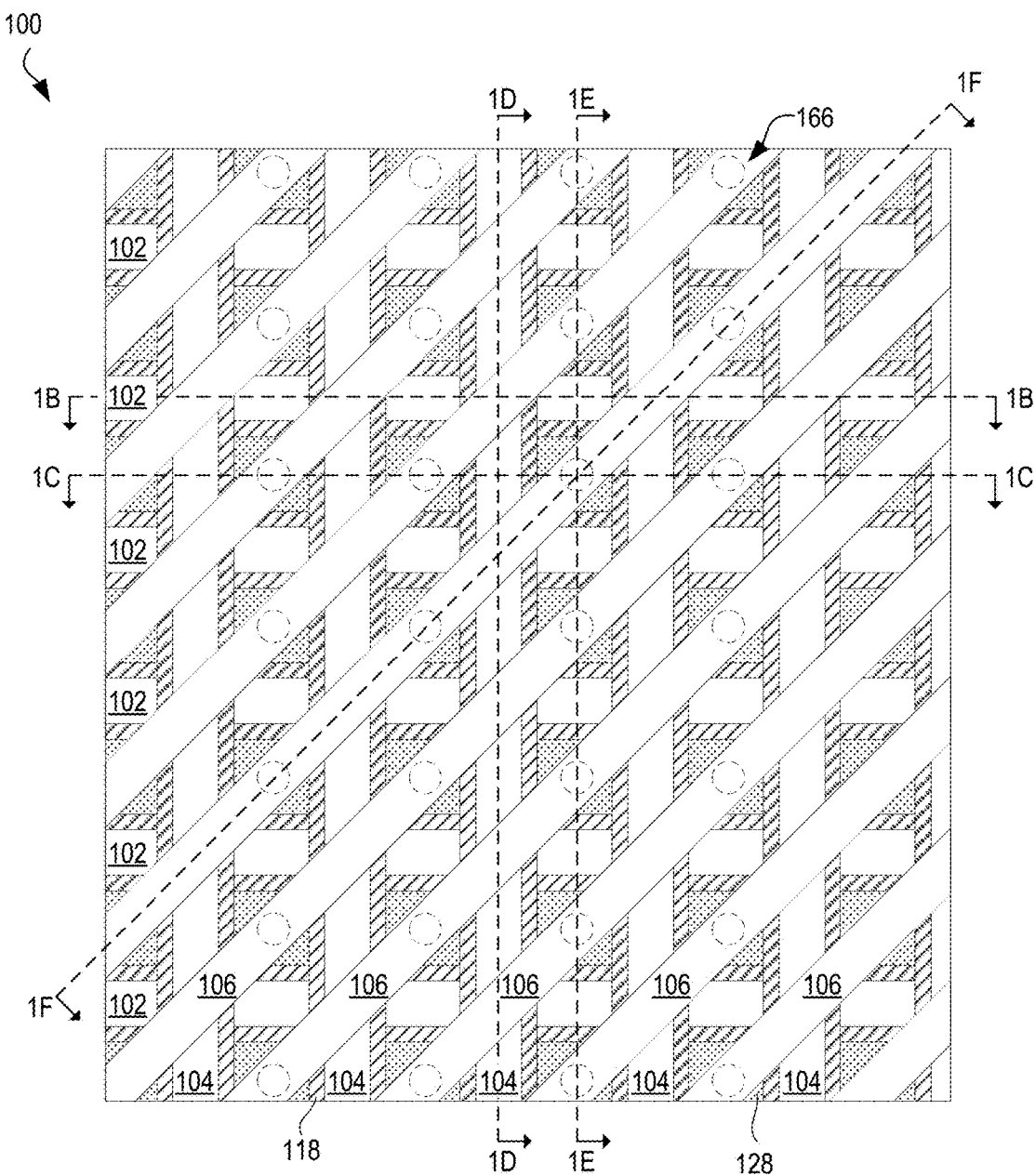

Aspects of the present disclosure may include a quantum processor die with coplanar waveguides carrying high-frequency radiofrequency or microwave signals. The coplanar waveguides can carry the signals with a relatively low signal loss. In the illustrative embodiment, a ground ring surrounds the signal paths to improve the ground connections. The carrier substrate for the quantum processor die can be any suitable material such as low-doped silicon, which can improve the mechanical structure of a wafer when manufactured, improving the yield of the quantum processor dies.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, a substrate assembly feature, such as a through width, that is described as having substantially a listed dimension can vary within a few percent of the listed dimension.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the terms "upper"/"lower" or "above"/ "below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

References are made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

A quantum computer uses quantum-mechanical phenomena such as superposition and entanglement to perform computations, simulations, or other functions. In contrast to digital computers, which store data in one of two definite states (0 or 1), quantum computation uses quantum bits (qubits), which can be in superpositions of states. Qubits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin." Qubits in quantum mechanical systems can be in a superposition of both states at the same time, a trait that is unique and fundamental to quantum computing.

Quantum computing systems execute algorithms containing quantum logic operations performed on qubits. In some cases, the result of the algorithm is not deterministic. The quantum algorithm may be repeated many times in order to determine a statistical distribution of results or in order to have a high likelihood of finding the correct answer. In some cases, a classical algorithm may be used to check if the quantum computer determined the correct result.

Qubits have been implemented using a variety of different technologies which are capable of manipulating and reading quantum states. These include but are not limited to quantum dot devices (spin-based and spatial-based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer, including, but not limited to, those listed above. The particular physical implementation used for qubits is not necessarily required for the embodiments of the invention described herein.

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figure 1B:
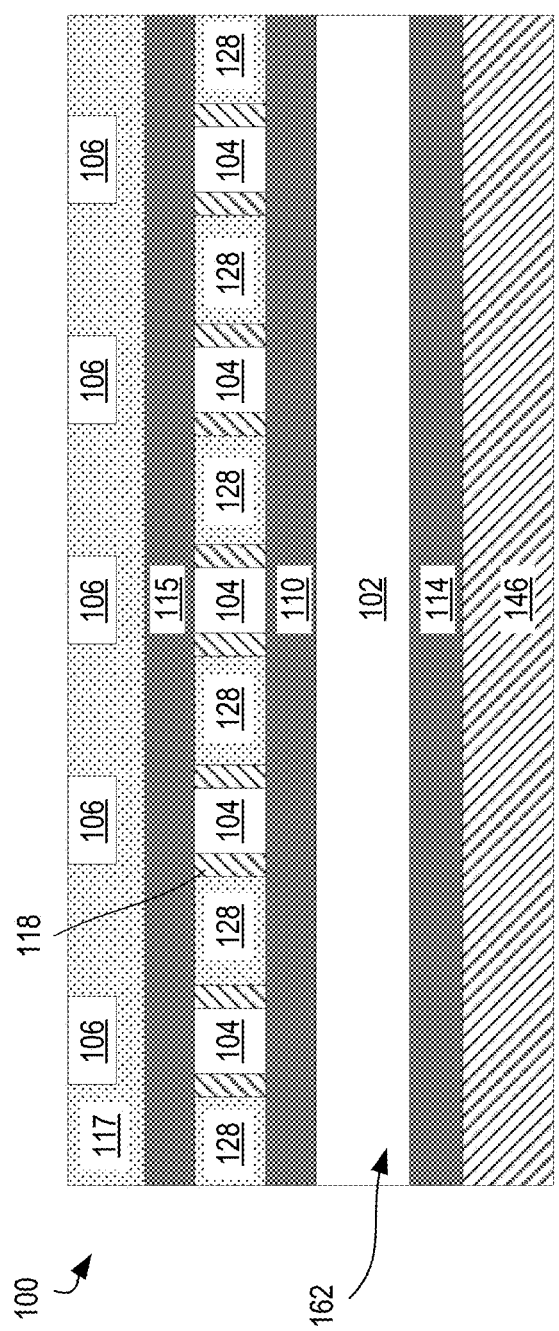
Figure 1C:
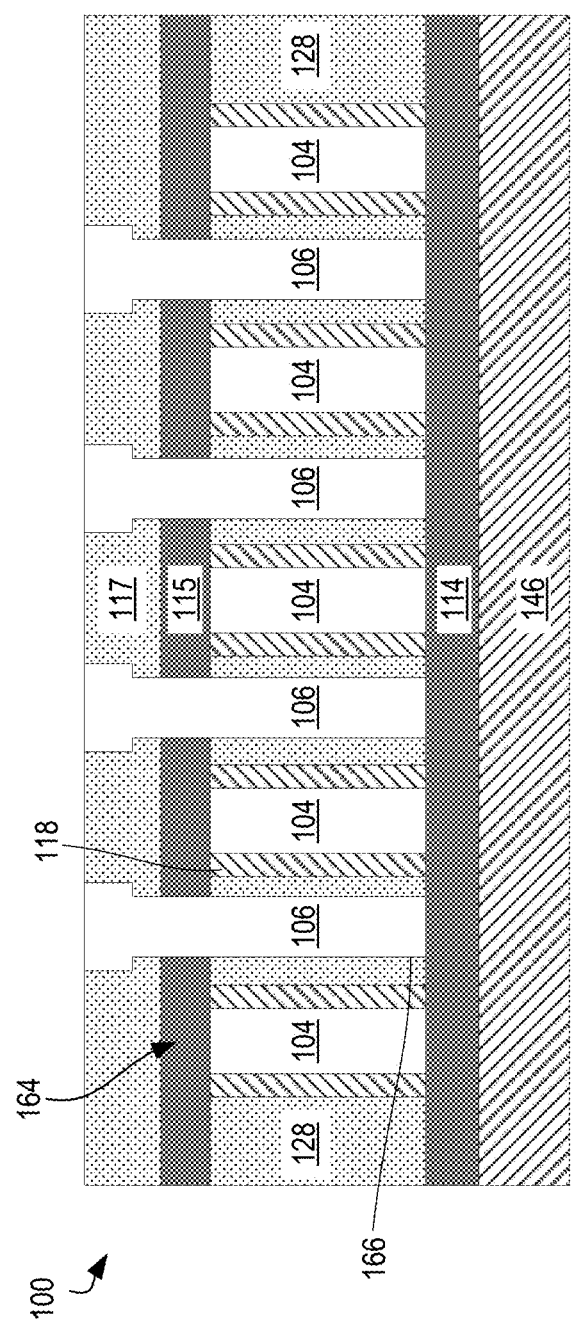
Figure 1F:
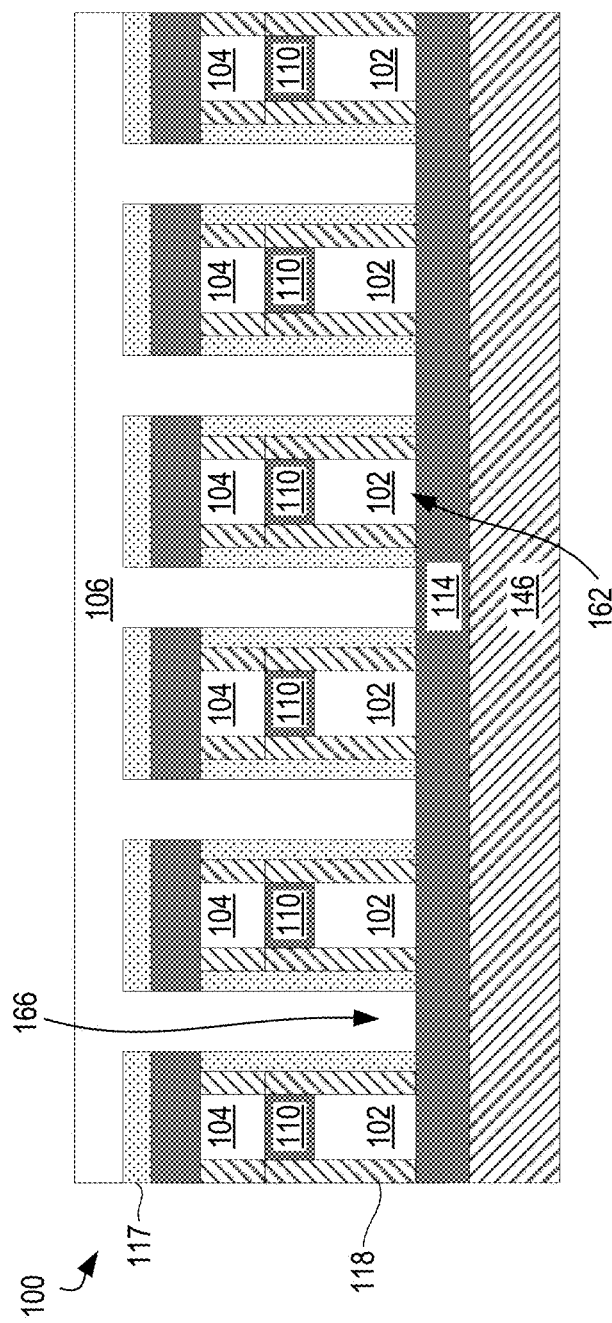

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Figure 2:
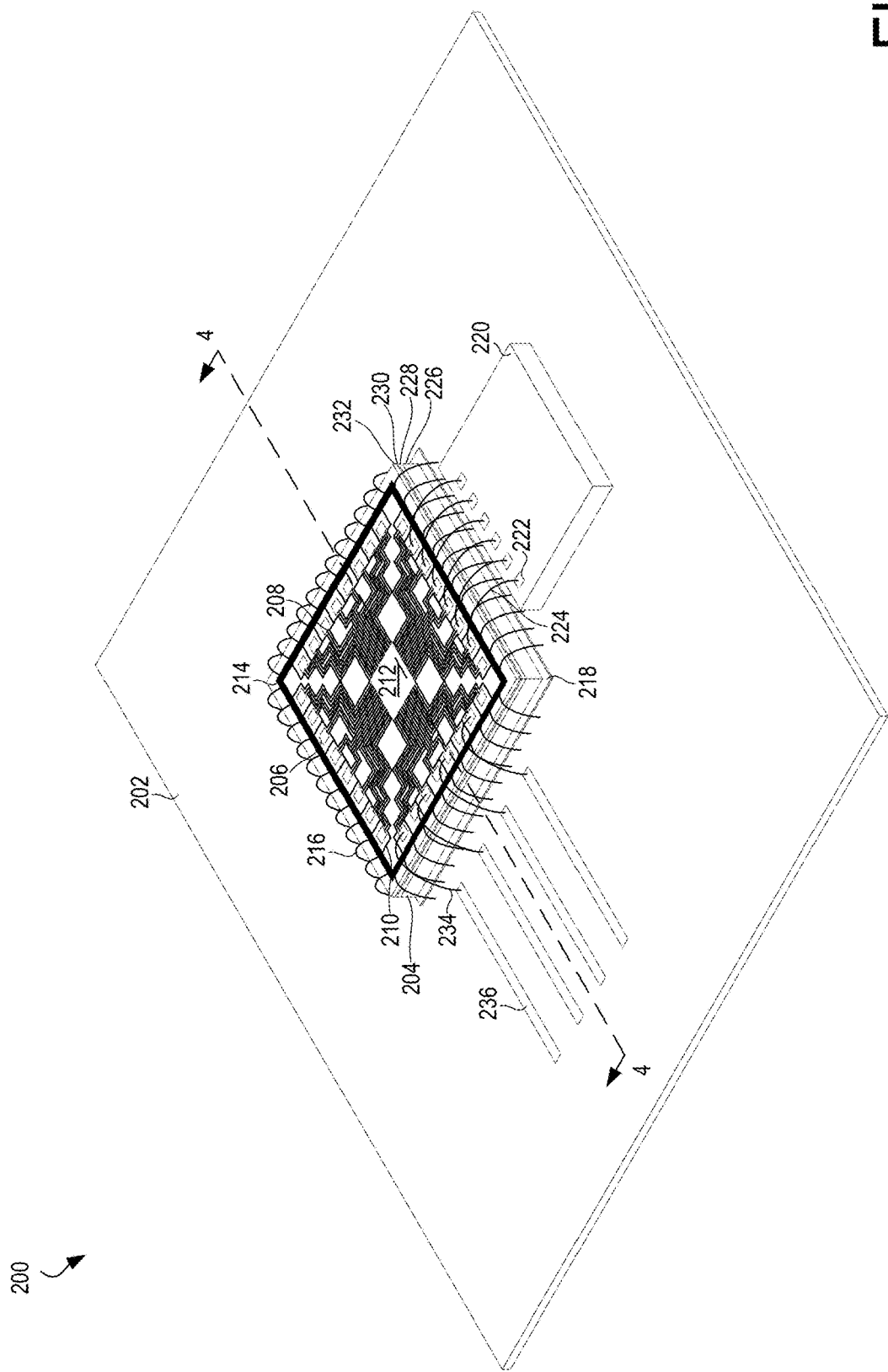
FIG. 2 is a simplified diagram of at least one embodiment of a system including a quantum processor die
Figure 3:
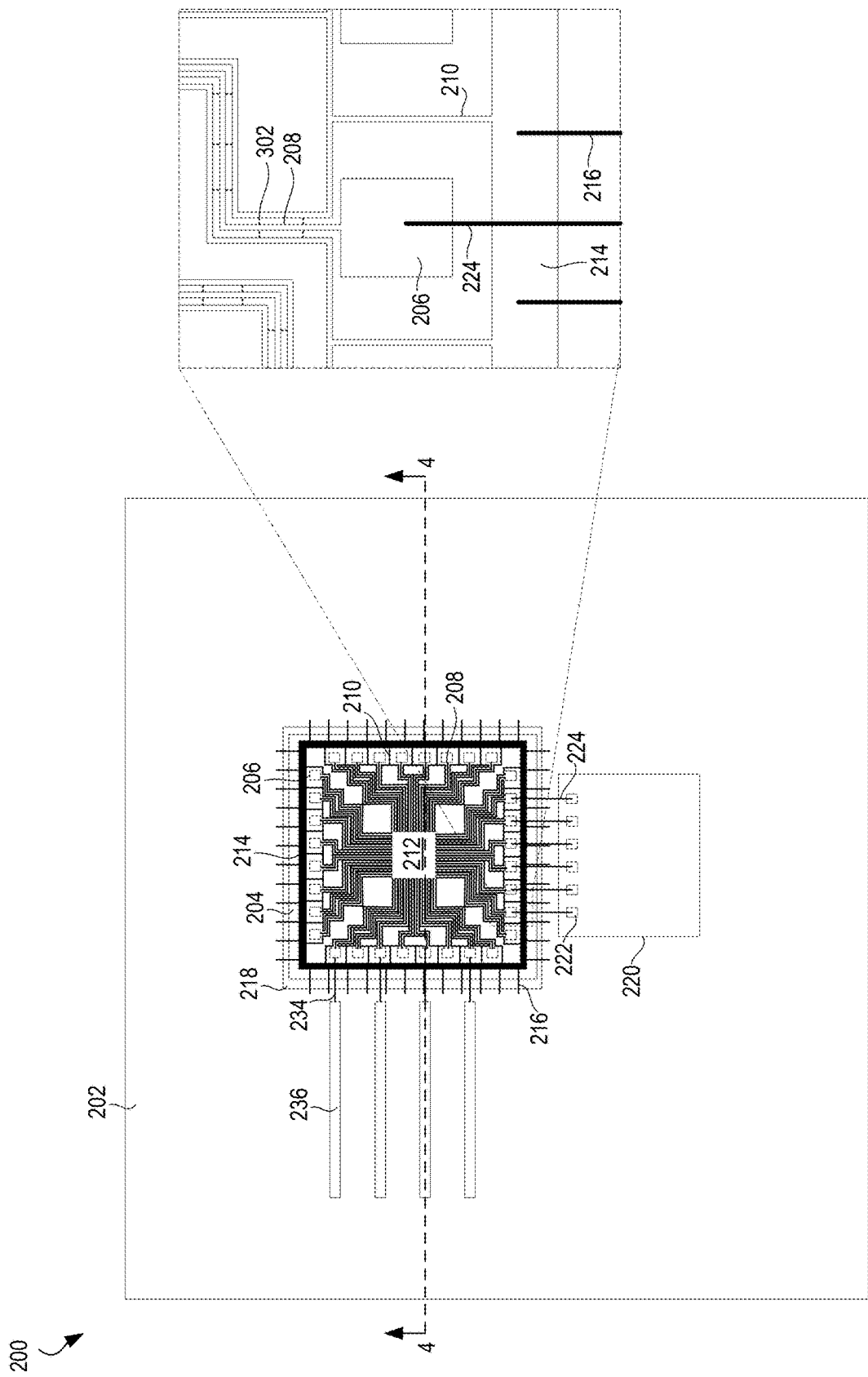
FIG. 3 is a top-down view of the system of FIG. 2.
Figure 4:
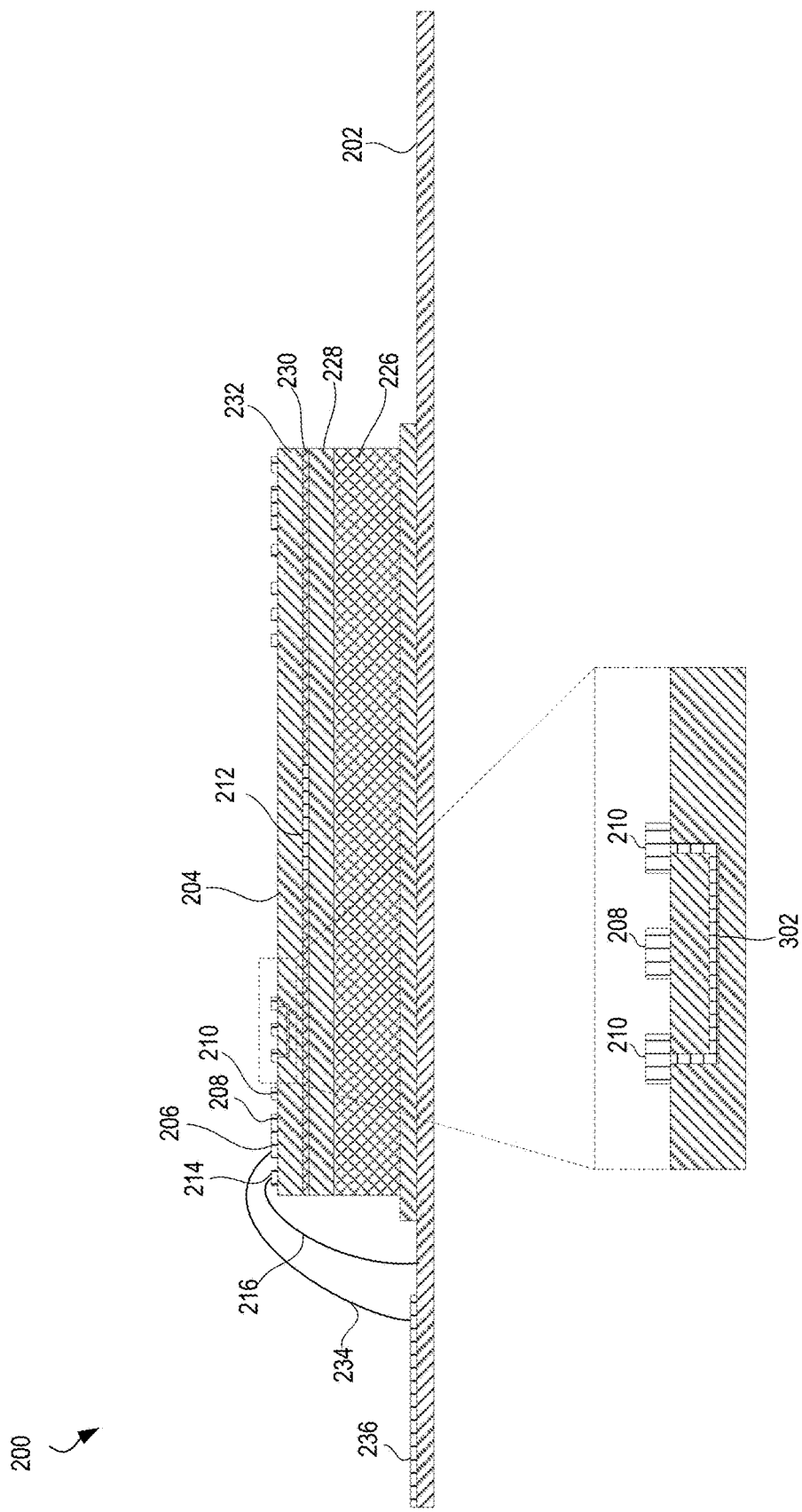
FIG. 4 is a cross-sectional view of the system of FIG. 2.

Referring now to FIGS. 2-4, a system 200 includes a circuit board 202 supporting a quantum processor die 204. FIG. 2 shows an isometric perspective view of the system 200, FIG. 3 shows a top-down view of the system 200 as well as a zoomed-in top-down view of a portion of the system 200, and FIG. 4 shows a cross-sectional view of the system 200. The quantum processor die 204 includes several signals pads 206. Each signal pad 206 is connected to a signal conductor 208 centered between two ground conductors 210. The signal conductor 208 and ground conductors 210 form a coplanar waveguide to carry a high-frequency signal. The signals are carried towards a qubit array 212 on the die, allowing for signals to be sent to and received from the qubits of the qubit array 212. The illustrative qubit array 212 includes several spin qubits, such as 4-1,024 spin qubits. In the illustrative embodiment, some or all of the signal conductors 208 can extend directly over or near one of the qubits of the qubit array 212. The signal pads 206 are connected by wire bonds 234 to signal traces 236 on the circuit board 202. The signal conductors 208 can carry signals to establish, manipulate, read, reset, etc., the qubits of the qubit array 212.

In the illustrative embodiment, a ground ring 214 surrounds the signal pads 206. The ground ring 214 is connected to a ground signal on the circuit board 202 with several wire bonds 216. The system 200 may include any suitable number of wire bonds 216 between the ground ring 214 and the circuit board 202, such as 8-100. In use, some or all of the system 200 is cooled to a low temperature, such as 10-100 millikelvin. It should be appreciated that the wire bonds 216 increase the thermal conductivity from the quantum processor die 204 to the circuit board 202, cooling the quantum processor die 204 and the qubit array 212.

In the illustrative embodiment, an isolation layer 218 is placed between the quantum processor die 214 and the circuit board 202. The isolation layer 218 may be used to electrically isolate the quantum processor die 214 from the circuit board 202 to improve RF performance. The isolation layer may be any suitable material with a low electrical conductivity and may have any suitable thickness, such as 0.1-5 millimeters.

In the illustrative embodiment, a chip 220 with an impedance matching network is connected to the quantum processor 204. Signal pads 222 on the chip 220 are connected to signal pads 206 on the quantum processor die 204 by one or more wire bonds 224. In the illustrative embodiment, an output signal to read a qubit in the qubit array 212 may have a relatively high impedance, such as 100-1,000 kiloohms. The impedance matching network on the chip 220 may transform the high impedance to, e.g., a 50 Ohm transmission line in order to facilitate reading the state of a qubit in the qubit array 212. It should be appreciated that, by wire bonding directly from the signal pad 206 on the quantum processor die 204 to the signal pad 222 on the chip 220 rather than first sending the signal along a trace on the circuit board 202, the signal quality can be improved.

In the illustrative embodiment, the quantum processor die 204 has a carrier substrate layer 226, a dielectric layer 228 on the carrier substrate layer 226, a silicon layer 230 on the dielectric later 228, and a dielectric layer 232 on the silicon layer 230. The carrier substrate layer 226 provides mechanical support to the other layers 228, 230, 232, both in use and during manufacture. The carrier substrate layer 226 may be any suitable material, such as low-doped silicon. In the illustrative embodiment, the carrier substrate layer 226 is silicon with a dopant concentration of less than $10^{15}$ dopant atoms per cubic centimeter and a resistance of more than 10 ohms per centimeter. In other embodiments, the carrier substrate layer 226 may be low-doped silicon with any suitable doping level, such as fewer than $10^{13}$-$10^{16}$ dopant atoms per cubic centimeter, and any suitable resistance, such as 1-5,000 ohms per centimeter. As used herein, low-doped silicon refers to silicon with a resistance of more than 10 ohms per centimeter, unless explicitly stated otherwise. It should be appreciated that, as the signals are carried on the coplanar waveguides on top of the quantum processor die 204 with explicit metal ground shielding, the carrier substrate layer 226 does not need to provide a ground for the signals, and a low-doped nonconductive carrier substrate and/or isolation layer may be desired to improve performance of RF signals.

The dielectric layers 228 and 230 electrically isolate the silicon layer 230 from the carrier substrate 226 and the environment on the surface of the quantum processor die 204. The qubit array 212 is formed in the silicon layer 230.

The circuit board 202 may be any suitable material, such as fiberglass. In the illustrative embodiment, the circuit board 202 may be FR-4. The circuit board 202 may have any suitable dimensions, such as a length and/or width of 10-200 millimeters. The circuit board 202 may have any suitable thickness, such as 1-5 millimeters. Additional components not shown in the figures may be on the circuit board 202, such as connectors, integrated circuit components, additional electrical traces, etc.

The quantum processor die 204 may have any suitable dimensions, such as a width and/or length of 1-25 millimeters and a thickness of 0.5-5 millimeters. Dielectric layers 228, 232 may have any suitable thickness, such as 0.05-1 millimeters. The silicon layer 230 may have any suitable thickness, such as 0.1-100 micrometers.

Figure 12:
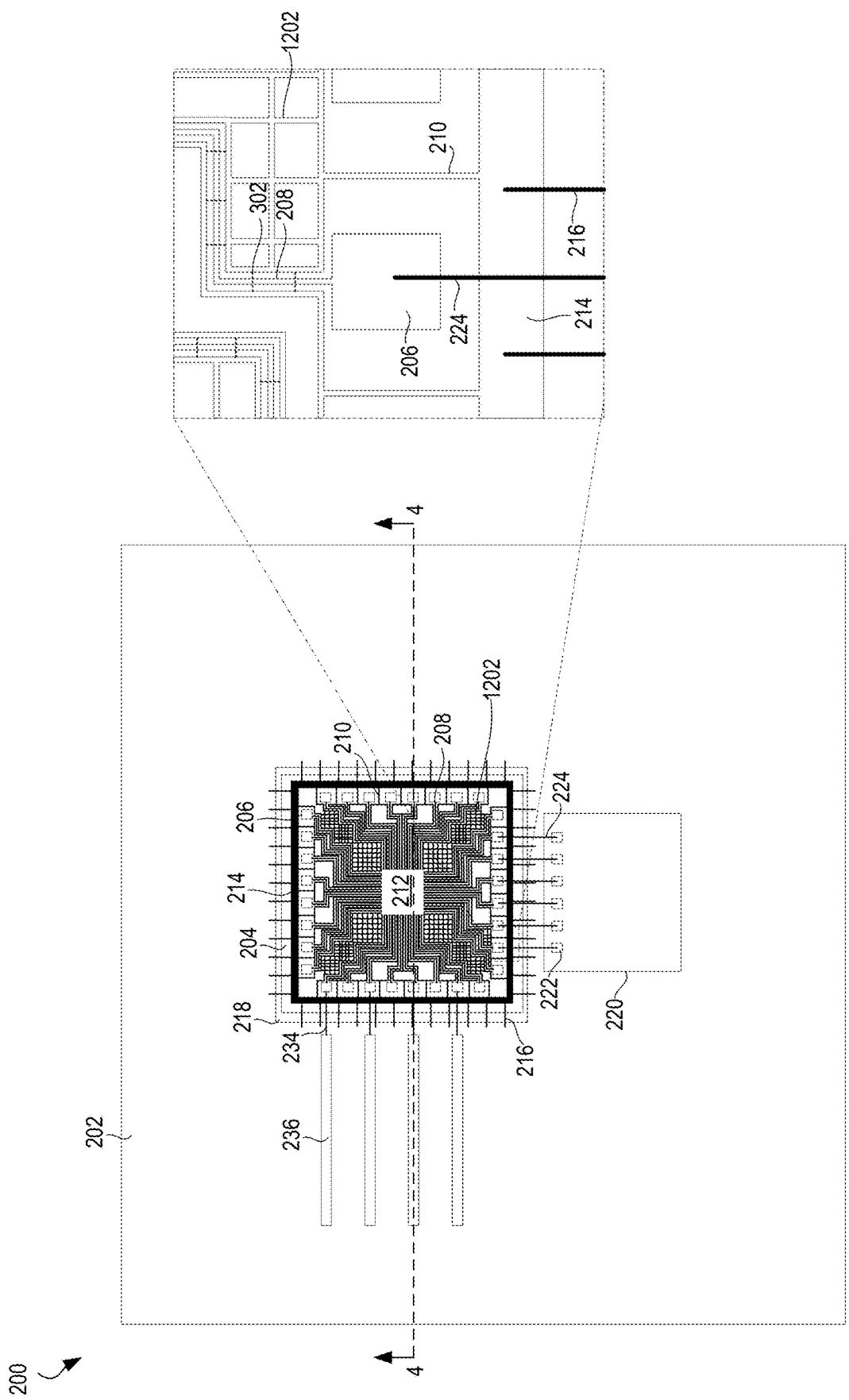
FIG. 12 is a top-down view of one embodiment of the system of FIG. 2.

The signal traces 208 may have any suitable height or width, such as a height of 0.05-1 micrometers and a width of 1-10 micrometers. In the illustrative embodiment, the signal traces 208 have a height of 100 nanometers and a width of 3 micrometers. The ground conductors 210 may be spaced apart from the signal traces 208 by any suitable distance, such as 1-10 micrometers to implement a specific characteristic impedance for improved RF power delivery to an open-ended qubit gate. In the illustrative embodiment, the ground conductors 210 are spaced apart from the signal traces 208 by 3 micrometers. The ground conductors 210 may have any suitable height, such as 0.05-1 micrometers. In the illustrative embodiment, the ground conductors 210 have a height of 100 nanometers. The ground conductors 210 may be embodied as strips, as shown in the inset of FIG. 3, with any suitable width, such as 1-10 micrometers. The ground conductors 210 are connected to the chip ground ring 214. In other embodiments, the ground conductors 210 may extend farther or cover most or all of the surface of the quantum processor die 204 that is not covered by a signal trace 208, signal pad 206, or space around the signal traces 208 and signal pads 206 that forms part of the coplanar waveguide to reduce ground inductance and thermal resistance. In still other embodiments, the ground conductors 210 may cover much of the surface as a mesh structure 1202 (see FIG. 12). In some embodiments, the signal traces 208 may turn with a higher radius of curvature than shown in the figures, such as a radius of curvature of 1-20 micrometers.

In the illustrative embodiment, ground straps 302 are periodically placed across the ground conductors 210 of each coplanar waveguide (see FIG. 3 inset and FIG. 4 inset). As the signal trace 208 divides the two ground conductors allowing them to be at a different potential, differential current modes can be supported. The ground straps 302 can suppress and dissipate undesired differential modes. The ground straps may have any suitable shape, such as a cross-section with a height and/or width of 0.5-10 micrometers. The ground straps are fabricated in the dielectric layer 232, underneath the signal traces 208.

The ground ring 214 may have any suitable dimensions. The ground ring 214 may have any suitable height, such as 0.05-1 micrometers. In the illustrative embodiment, the ground ring 214 has a height of 100 nanometers. The ground ring may have any suitable width, such as 1-200 micrometers.

The signal traces 208, 236, signal pads 206, 222, ground conductors 210, ground ring 214, wire bonds 234, 216, 222, and/or ground straps 302 may be any suitable material, such as copper, gold, niobium nitride, etc. In the illustrative embodiment, some or all of the signal traces 208, 236, signal pads 206, 222, ground conductors 210, wire bonds 234, 216, 222, and/or ground straps 302 may be superconducting at an operating temperature of the system 200. In the illustrative embodiment, the ground straps 302 may be relatively lossy in order to suppress differential modes in the coplanar waveguides.

Figure 5:
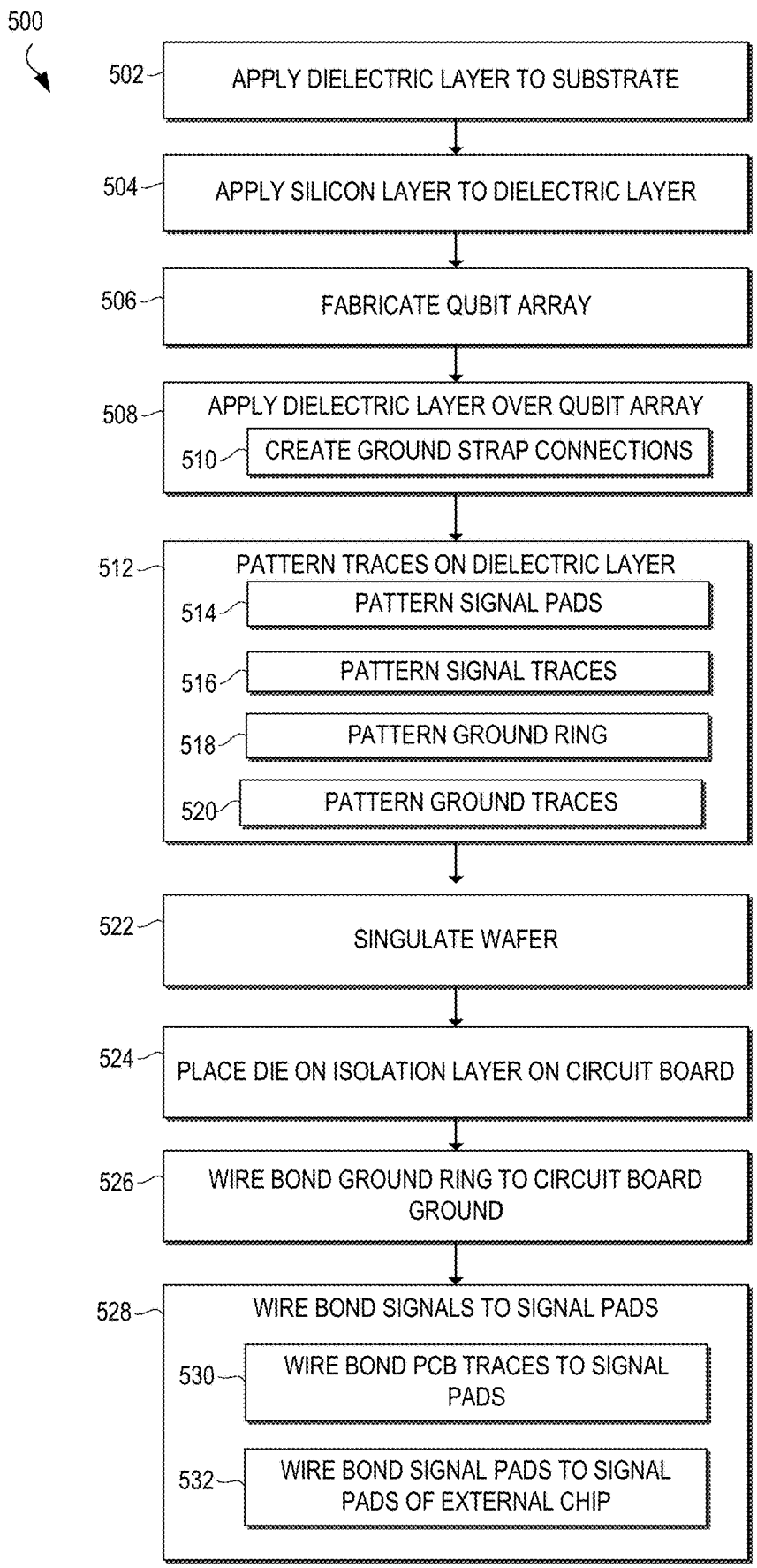
FIG. 5 is a simplified flow diagram of at least one embodiment of a method for creating the system of FIG. 2.

Referring now to FIG. 5, in one embodiment, a flowchart for a method 500 for manufacturing the system 200 is shown. The method 500 may be executed by a technician and/or by one or more automated machines. In some embodiments, one or more machines may be programmed to do some or all of the steps of the method 500. Such a machine may include, e.g., a memory, a processor, data storage, etc. The memory and/or data storage may store instructions that, when executed by the machine, causes the machine to perform some or all of the steps of the method 500. The method 500 may use any suitable set of techniques that are used in semiconductor or printed circuit board processing, such as chemical vapor deposition, atomic layer deposition, physical layer deposition, molecular beam epitaxy, layer transfer, photolithography, ion implantation, dry etching, wet etching, thermal treatments, flip chip, layer transfer, magnetron sputter deposition, pulsed laser deposition, etc. It should be appreciated that the method 500 is merely one embodiment of a method to create the system 200, and other methods may be used to create the system 200.

The method 500 begins in block 502, in which a dielectric layer 228 is applied to a carrier substrate 226. In the illustrative embodiment, the carrier substrate 266 is a wafer with a diameter over 250 millimeters, such as about 300 millimeters. In block 504, a silicon layer 230 is applied to the dielectric layer 228. In block 506, the qubit array 212 is fabricated in the silicon layer 230.

In block 508, the dielectric layer 232 is applied over the silicon layer 230. In block 510, as part of applying the dielectric layer 232, ground strap 302 connections are formed that will connect the two ground conductors 210 on either side of the signal traces 208.

In block 512, traces on the surface of the dielectric layer 232 are patterned. The signal pads 206 are patterned in block 514, the signal traces 208 are patterned in block 516, the ground ring 214 is patterned in block 518, and the ground traces 210 are patterned in block 520. In the illustrative embodiment, all of the traces on the surface of the dielectric layer 232 are patterned at the same time.

In block 522, the wafer is singulated into individual quantum processor dies 204. In block 524, a quantum processor die 204 is placed on an isolation layer 218 on a circuit board 202. In block 526, the ground ring 514 is connected to a ground of the circuit board 202 using several wire bonds 216. In block 528, signal pads 206 on the quantum processor die 204 are wire bonded to signals. In block 530, signal traces 236 are wire bonded to signal pads 206 on the quantum processor die 204, and, in block 532, signal pads 222 on the chip 220 are wire bonded to signal pads 206 on the quantum processor die 204.

Figure 6:
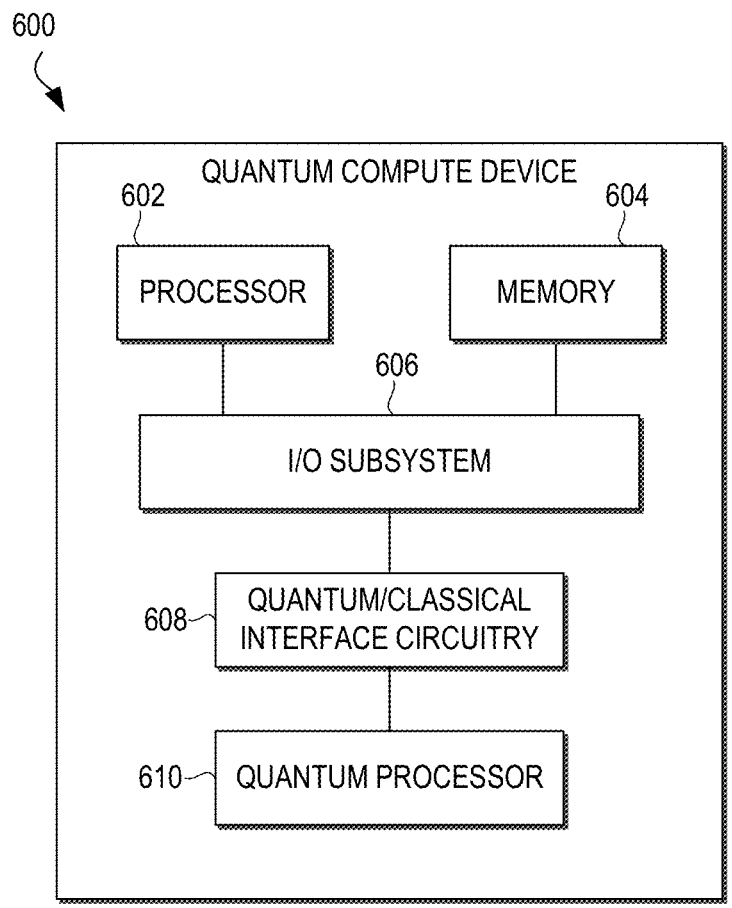
FIG. 6 is a simplified block diagram of at least one embodiment of a quantum compute device.

Referring now to FIG. 6, a simplified block diagram of a quantum compute device 600 is shown. In some embodiments, the quantum compute device 600 may include the quantum dot devices 100 described above in regard to FIGS. 1A-1F and/or the quantum processor die 204 described above in regard to FIGS. 2-5. The quantum compute device 600 may be embodied as or included in any type of compute device. For example, the quantum compute device 600 may include or otherwise be included in, without limitation, a server computer, an embedded computing system, a System-on-a-Chip (SoC), a multiprocessor system, a processor-based system, a consumer electronic device, a desktop computer, a laptop computer, a network device, a networked computer, a distributed computing system, and/or any other computing device. The illustrative quantum compute device 600 includes a processor 602, a memory 604, an input/output (I/O) subsystem 606, a quantum/classical interface circuitry 608, and a quantum processor 610. In some embodiments, one or more of the illustrative components of the quantum compute device 600 may be incorporated in, or otherwise form a portion of, another component. For example, the memory 604, or portions thereof, may be incorporated in the processor 602 in some embodiments. In some embodiments, the quantum compute device 600 may be embodied as the electrical device 1100 described below in regard to FIG. 11 or may include any suitable component of the electrical device 1100.

In some embodiments, the quantum compute device 600 may be located in a data center with other compute devices, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves), a micro data center, etc. In some embodiments, the quantum compute device 600 may receive jobs over a network (such as the Internet) to perform on the quantum processor 610. The quantum compute device 600 may perform the jobs on the quantum processor 610 and send the results back to the requesting device.

The processor 602 may be embodied as any type of processor capable of performing the functions described herein. For example, the processor 602 may be embodied as a single or multi-core processor(s), a single or multi-socket processor, a digital signal processor, a graphics processor, a neural network compute engine, an image processor, a microcontroller, or other processor or processing/controlling circuit. The processor 602 may include multiple processor cores. In some embodiments, the processor 602 supports quantum extensions to an existing ISA of the processor/core 602, allowing instructions that interface with the quantum/classical interface circuitry 608 and the quantum processor 610.

The memory 604 may be embodied as any type of volatile or non-volatile memory or data storage capable of performing the functions described herein. In operation, the memory 604 may store various data and software used during operation of the quantum compute device 600, such as operating systems, applications, programs, libraries, and drivers. The memory 604 is communicatively coupled to the processor 602 via the I/O subsystem 606, which may be embodied as circuitry and/or components to facilitate input/output operations with the processor 602, the memory 604, and other components of the quantum compute device 600. For example, the I/O subsystem 606 may be embodied as, or otherwise include, memory controller hubs, input/output control hubs, firmware devices, communication links (e.g., point-to-point links, bus links, wires, cables, light guides, printed circuit board traces, etc.) and/or other components and subsystems to facilitate the input/output operations. The I/O subsystem 606 may connect various internal and external components of the quantum compute device 600 to each other with use of any suitable connector, interconnect, bus, protocol, etc., such as an SoC fabric, PCIe®, USB2, USB3, USB4, NVMe®, Thunderbolt®, Compute Express Link (CXL), and/or the like. In some embodiments, the I/O subsystem 606 may form a portion of a system-on-a-chip (SoC) and be incorporated, along with the processor 602 and the memory 604 and other components of the quantum compute device 600 on a single integrated circuit chip.

The quantum/classical interface circuitry 608 is configured to interface with both classical components of the quantum compute device 600, such as the processor 602 and memory 604, as well as the quantum processor 610. The quantum/classical interface circuitry 608 may include a variety of analog or digital circuitry, such as analog-to-digital converters, digital-to-analog converters, high gain amplifiers, low noise amplifiers, cryogenic amplifiers, field-programmable gate arrays (FPGAs), classical processors, application-specific integrated circuits (ASICs), signal conditioning circuitry, etc. In some embodiments, some or all of the quantum/classical interface circuitry 608 may be inside of a refrigerator, such as a dilution refrigerator, a magnetic refrigerator, a helium-4 and/or helium-3 refrigerator, etc. Some or all of the components of the quantum/classical interface circuitry 608 may be at any suitable temperature, such as 10 millikelvin, 100 millikelvin, 4 Kelvin, 20 Kelvin, 77 Kelvin, room temperature or above, or anywhere in between.

The quantum processor 610 is configured to operate one or more qubits. The quantum processor 610 may include the quantum processor die 204 and/or other suitable components of the system 200. The qubits may be any suitable type of qubit, such as a quantum dot spin qubit described above in regard to FIGS. 1A-1F. In other embodiments, the qubits may be, e.g., charge qubits, transmon qubits, microwave qubits, superconducting qubits, or any other suitable type of qubits. The quantum processor 610 may include any suitable number of physical or logical qubits, such as 1-$10^6$. In the illustrative embodiment, some or all of the quantum processor 610 is in a refrigerator such as a dilution refrigerator. In particular, in the illustrative embodiment, the qubits are held at a temperature of about 10 millikelvin. In other embodiments, the qubits may be held at any suitable temperature, such as 1-100 millikelvin or higher, depending on the temperature sensitivity of the particular qubit in use.

The quantum processor 610 may be able to control the various qubits in various ways, such as by performing two-qubit gates, three-qubit gates, error correction operations, transferring a state from one type of qubit to another, measuring some, any or, all of the qubits, initializing some, any, or all of the qubits, etc.

The quantum compute device 600 may include additional components not shown in FIG. 6, such as one or more data storage devices, a network interface controller, one or more peripheral devices, etc.

Figure 7:
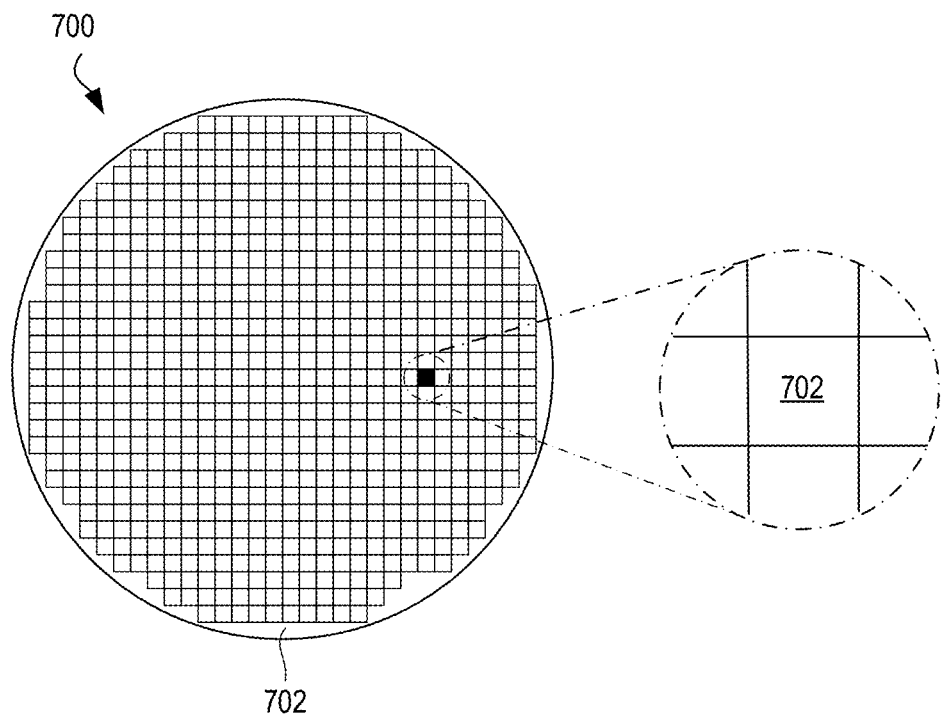
FIG. 7 is a top view of a wafer and dies, in accordance with any of the embodiments disclosed herein.

FIG. 7 is a top view of a wafer 700 and dies 702 that may be included in the system 200 disclosed herein (e.g., as a suitable quantum processor die 204). The wafer 700 may be composed of semiconductor material and may include one or more dies 702 having integrated circuit structures formed on a surface of the wafer 700. The individual dies 702 may be a repeating unit of an integrated circuit product that includes any suitable integrated circuit. After the fabrication of the semiconductor product is complete, the wafer 700 may undergo a singulation process in which the dies 702 are separated from one another to provide discrete "chips" of the integrated circuit product. The die 702 may be any of the dies 204 disclosed herein. The die 702 may include one or more transistors (e.g., some of the transistors 840 of FIG. 8, discussed below), supporting circuitry to route electrical signals to the transistors, passive components (e.g., signal traces, resistors, capacitors, or inductors), and/or any other integrated circuit components. In some embodiments, the wafer 700 or the die 702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processor unit (e.g., the processor unit 1102 of FIG. 11) or other logic that is configured to store information in the memory devices or execute instructions stored in the memory array. Various ones of the systems 200 disclosed herein may be manufactured using a die-to-wafer assembly technique in which some dies 204 are attached to a wafer 700 that include others of the dies 204, and the wafer 700 is subsequently singulated.

Figure 8:
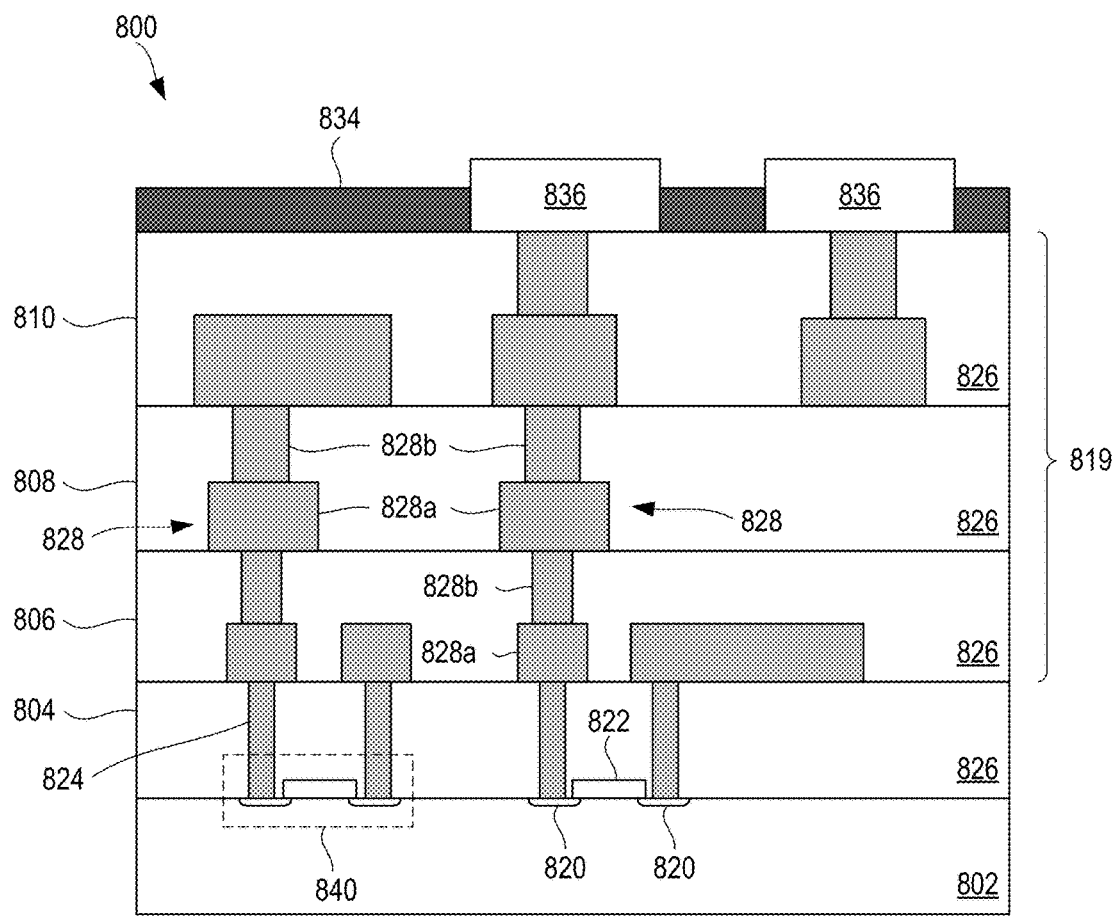
FIG. 8 is a cross-sectional side view of an integrated circuit, in accordance with any of the embodiments disclosed herein.

FIG. 8 is a cross-sectional side view of an integrated circuit device 800 that may be included in any of the systems 200 disclosed herein (e.g., in any of the dies 204). One or more of the integrated circuit devices 800 may be included in one or more dies 702 (FIG. 7). The integrated circuit device 800 may be formed on a die substrate 802 (e.g., the wafer 700 of FIG. 7) and may be included in a die (e.g., the die 702 of FIG. 7). The die substrate 802 may be a semiconductor substrate composed of semiconductor material systems including, for example, n-type or p-type materials systems (or a combination of both). The die substrate 802 may include, for example, a crystalline substrate formed using a bulk silicon or a silicon-on-insulator (SOI) substructure. In some embodiments, the die substrate 802 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 802. Although a few examples of materials from which the die substrate 802 may be formed are described here, any material that may serve as a foundation for an integrated circuit device 800 may be used. The die substrate 802 may be part of a singulated die (e.g., the dies 702 of FIG. 7) or a wafer (e.g., the wafer 700 of FIG. 7).

The integrated circuit device 800 may include one or more device layers 804 disposed on the die substrate 802. The device layer 804 may include features of one or more transistors 840 (e.g., metal oxide semiconductor field-effect transistors (MOSFETs)) formed on the die substrate 802. The transistors 840 may include, for example, one or more source and/or drain (S/D) regions 820, a gate 822 to control current flow between the S/D regions 820, and one or more S/D contacts 824 to route electrical signals to/from the S/D regions 820. The transistors 840 may include additional features not depicted for the sake of clarity, such as device isolation regions, gate contacts, and the like. The transistors 840 are not limited to the type and configuration depicted in FIG. 8 and may include a wide variety of other types and configurations such as, for example, planar transistors, non-planar transistors, or a combination of both. Non-planar transistors may include FinFET transistors, such as doublegate transistors or tri-gate transistors, and wrap-around or all-around gate transistors, such as nanoribbon, nanosheet, or nanowire transistors.

FIGS. 9A-9D are simplified perspective views of example planar, FinFET, gate-all-around, and stacked gate-all-around transistors. The transistors illustrated in FIGS. 9A-9D are formed on a substrate 916 having a surface 908. Isolation regions 914 separate the source and drain regions of the transistors from other transistors and from a bulk region 918 of the substrate 916.

Figure 9B:
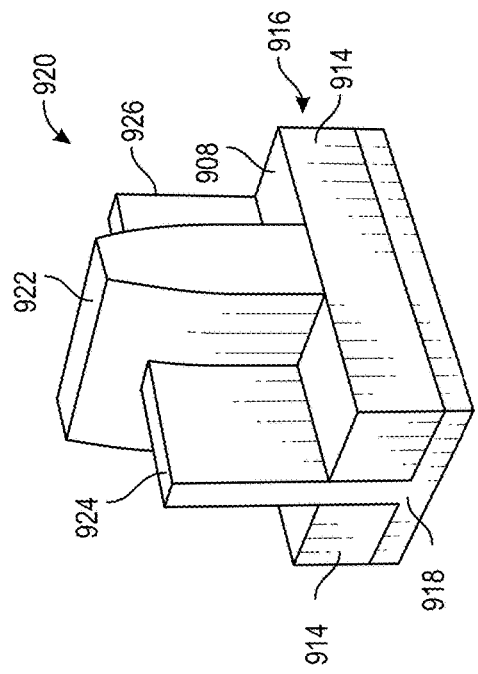
FIGS. 9A-9D are perspective views of example planar, gate-all-around, and stacked gate-all-around transistors.
Figure 9D:
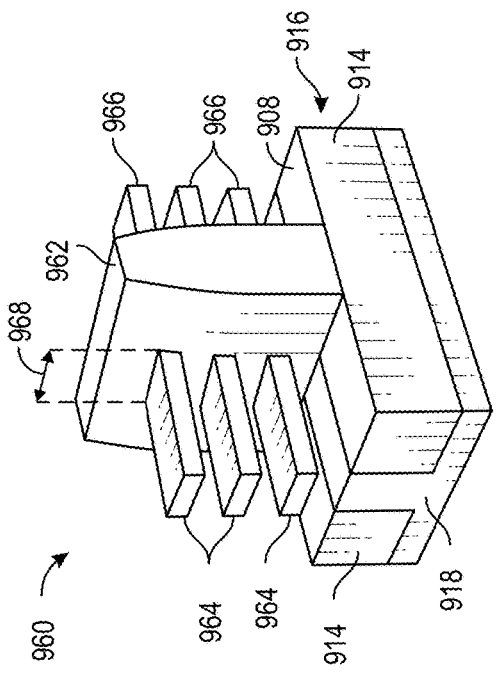
Figure 9A:
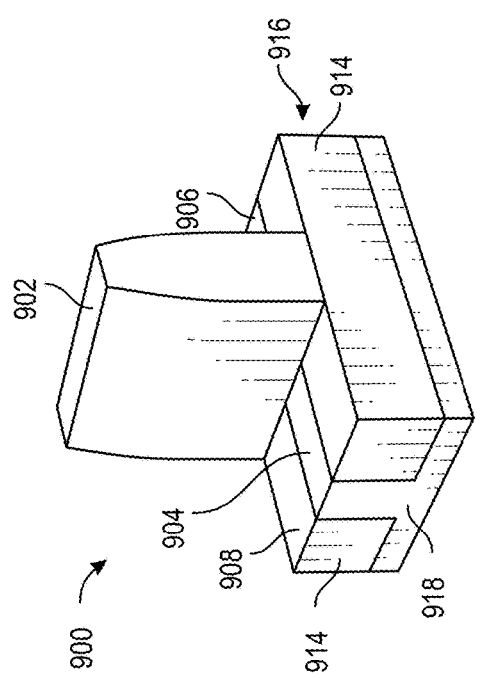

FIG. 9A is a perspective view of an example planar transistor 900 comprising a gate 902 that controls current flow between a source region 904 and a drain region 906. The transistor 900 is planar in that the source region 904 and the drain region 906 are planar with respect to the substrate surface 908.

FIG. 9B is a perspective view of an example FinFET transistor 920 comprising a gate 922 that controls current flow between a source region 924 and a drain region 926. The transistor 920 is non-planar in that the source region 924 and the drain region 926 comprise "fins" that extend upwards from the substrate surface 928. As the gate 922 encompasses three sides of the semiconductor fin that extends from the source region 924 to the drain region 926, the transistor 920 can be considered a tri-gate transistor. FIG. 9B illustrates one S/D fin extending through the gate 922, but multiple S/D fins can extend through the gate of a FinFET transistor.

Figure 9C:
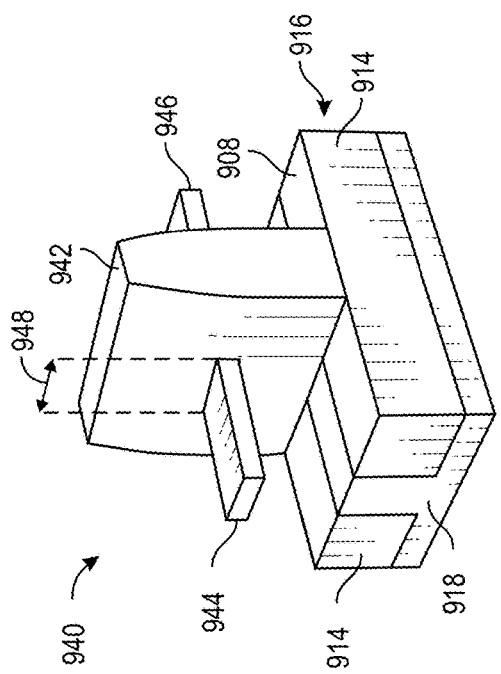

FIG. 9C is a perspective view of a gate-all-around (GAA) transistor 940 comprising a gate 942 that controls current flow between a source region 944 and a drain region 946. The transistor 940 is non-planar in that the source region 944 and the drain region 946 are elevated from the substrate surface 928.

FIG. 9D is a perspective view of a GAA transistor 960 comprising a gate 962 that controls current flow between multiple elevated source regions 964 and multiple elevated drain regions 966. The transistor 960 is a stacked GAA transistor as the gate controls the flow of current between multiple elevated S/D regions stacked on top of each other. The transistors 940 and 960 are considered gate-all-around transistors as the gates encompass all sides of the semiconductor portions that extends from the source regions to the drain regions. The transistors 940 and 960 can alternatively be referred to as nanowire, nanosheet, or nanoribbon transistors depending on the width (e.g., widths 948 and 968 of transistors 940 and 960, respectively) of the semiconductor portions extending through the gate.

Returning to FIG. 8, a transistor 840 may include a gate 822 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 840 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 840 along the source-channel-drain direction, the gate electrode may consist of a U-shaped structure that includes a bottom portion substantially parallel to the surface of the die substrate 802 and two sidewall portions that are substantially perpendicular to the top surface of the die substrate 802. In other embodiments, at least one of the metal layers that form the gate electrode may simply be a planar layer that is substantially parallel to the top surface of the die substrate 802 and does not include sidewall portions substantially perpendicular to the top surface of the die substrate 802. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 820 may be formed within the die substrate 802 adjacent to the gate 822 of individual transistors 840. The S/D regions 820 may be formed using an implantation/diffusion process or an etching/deposition process, for example. In the former process, dopants such as boron, aluminum, antimony, phosphorous, or arsenic may be ion-implanted into the die substrate 802 to form the S/D regions 820. An annealing process that activates the dopants and causes them to diffuse farther into the die substrate 802 may follow the ion-implantation process. In the latter process, the die substrate 802 may first be etched to form recesses at the locations of the S/D regions 820. An epitaxial deposition process may then be carried out to fill the recesses with material that is used to fabricate the S/D regions 820.

In some implementations, the S/D regions 820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 820 may be formed using one or more alternate semiconductor materials such as germanium or a group III-V material or alloy. In further embodiments, one or more layers of metal and/or metal alloys may be used to form the S/D regions 820.

Electrical signals, such as power and/or input/output (I/O) signals, may be routed to and/or from the devices (e.g., transistors 840) of the device layer 804 through one or more interconnect layers disposed on the device layer 804 (illustrated in FIG. 8 as interconnect layers 806-810). For example, electrically conductive features of the device layer 804 (e.g., the gate 822 and the S/D contacts 824) may be electrically coupled with the interconnect structures 828 of the interconnect layers 806-810. The one or more interconnect layers 806-810 may form a metallization stack (also referred to as an "ILD stack") 819 of the integrated circuit device 800.

The interconnect structures 828 may be arranged within the interconnect layers 806-810 to route electrical signals according to a wide variety of designs; in particular, the arrangement is not limited to the particular configuration of interconnect structures 828 depicted in FIG. 8. Although a particular number of interconnect layers 806-810 is depicted in FIG. 8, embodiments of the present disclosure include integrated circuit devices having more or fewer interconnect layers than depicted.

In some embodiments, the interconnect structures 828 may include lines 828a and/or vias 828b filled with an electrically conductive or superconductive material such as a metal. The lines 828a may be arranged to route electrical signals in a direction of a plane that is substantially parallel with a surface of the die substrate 802 upon which the device layer 804 is formed. For example, the lines 828a may route electrical signals in a direction in and out of the page and/or in a direction across the page. The vias 828b may be arranged to route electrical signals in a direction of a plane that is substantially perpendicular to the surface of the die substrate 802 upon which the device layer 804 is formed. In some embodiments, the vias 828b may electrically couple lines 828a of different interconnect layers 806-810 together.

The interconnect layers 806-810 may include a dielectric material 826 disposed between the interconnect structures 828, as shown in FIG. 8. In some embodiments, dielectric material 826 disposed between the interconnect structures 828 in different ones of the interconnect layers 806-810 may have different compositions; in other embodiments, the composition of the dielectric material 826 between different interconnect layers 806-810 may be the same. The device layer 804 may include a dielectric material 826 disposed between the transistors 840 and a bottom layer of the metallization stack as well. The dielectric material 826 included in the device layer 804 may have a different composition than the dielectric material 826 included in the interconnect layers 806-810; in other embodiments, the composition of the dielectric material 826 in the device layer 804 may be the same as a dielectric material 826 included in any one of the interconnect layers 806-810.

A first interconnect layer 806 (referred to as Metal 1 or "M1") may be formed directly on the device layer 804. In some embodiments, the first interconnect layer 806 may include lines 828a and/or vias 828b, as shown. The lines 828a of the first interconnect layer 806 may be coupled with contacts (e.g., the S/D contacts 824) of the device layer 804. The vias 828b of the first interconnect layer 806 may be coupled with the lines 828a of a second interconnect layer 808.

The second interconnect layer 808 (referred to as Metal 2 or "M2") may be formed directly on the first interconnect layer 806. In some embodiments, the second interconnect layer 808 may include via 828b to couple the lines 828 of the second interconnect layer 808 with the lines 828a of a third interconnect layer 810. Although the lines 828a and the vias 828b are structurally delineated with a line within individual interconnect layers for the sake of clarity, the lines 828a and the vias 828b may be structurally and/or materially contiguous (e.g., simultaneously filled during a dual-damascene process) in some embodiments.

The third interconnect layer 810 (referred to as Metal 3 or "M3") (and additional interconnect layers, as desired) may be formed in succession on the second interconnect layer 808 according to similar techniques and configurations described in connection with the second interconnect layer 808 or the first interconnect layer 806. In some embodiments, the interconnect layers that are "higher up" in the metallization stack 819 in the integrated circuit device 800 (i.e., farther away from the device layer 804) may be thicker that the interconnect layers that are lower in the metallization stack 819, with lines 828a and vias 828b in the higher interconnect layers being thicker than those in the lower interconnect layers.

The integrated circuit device 800 may include a solder resist material 834 (e.g., polyimide or similar material) and one or more conductive contacts 836 formed on the interconnect layers 806-810. In FIG. 8, the conductive contacts 836 are illustrated as taking the form of bond pads. The conductive contacts 836 may be electrically coupled with the interconnect structures 828 and configured to route the electrical signals of the transistor(s) 840 to external devices. For example, solder bonds may be formed on the one or more conductive contacts 836 to mechanically and/or electrically couple an integrated circuit die including the integrated circuit device 800 with another component (e.g., a printed circuit board). The integrated circuit device 800 may include additional or alternate structures to route the electrical signals from the interconnect layers 806-810; for example, the conductive contacts 836 may include other analogous features (e.g., posts) that route the electrical signals to external components.

In some embodiments in which the integrated circuit device 800 is a double-sided die, the integrated circuit device 800 may include another metallization stack (not shown) on the opposite side of the device layer(s) 804. This metallization stack may include multiple interconnect layers as discussed above with reference to the interconnect layers 806-810, to provide conductive pathways (e.g., including conductive lines and vias) between the device layer(s) 804 and additional conductive contacts (not shown) on the opposite side of the integrated circuit device 800 from the conductive contacts 836.

In other embodiments in which the integrated circuit device 800 is a double-sided die, the integrated circuit device 800 may include one or more through silicon vias (TSVs) through the die substrate 802; these TSVs may make contact with the device layer(s) 804, and may provide conductive pathways between the device layer(s) 804 and additional conductive contacts (not shown) on the opposite side of the integrated circuit device 800 from the conductive contacts 836. In some embodiments, TSVs extending through the substrate can be used for routing power and ground signals from conductive contacts on the opposite side of the integrated circuit device 800 from the conductive contacts 836 to the transistors 840 and any other components integrated into the die 800, and the metallization stack 819 can be used to route I/O signals from the conductive contacts 836 to transistors 840 and any other components integrated into the die 800.

Multiple integrated circuit devices 800 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 10:
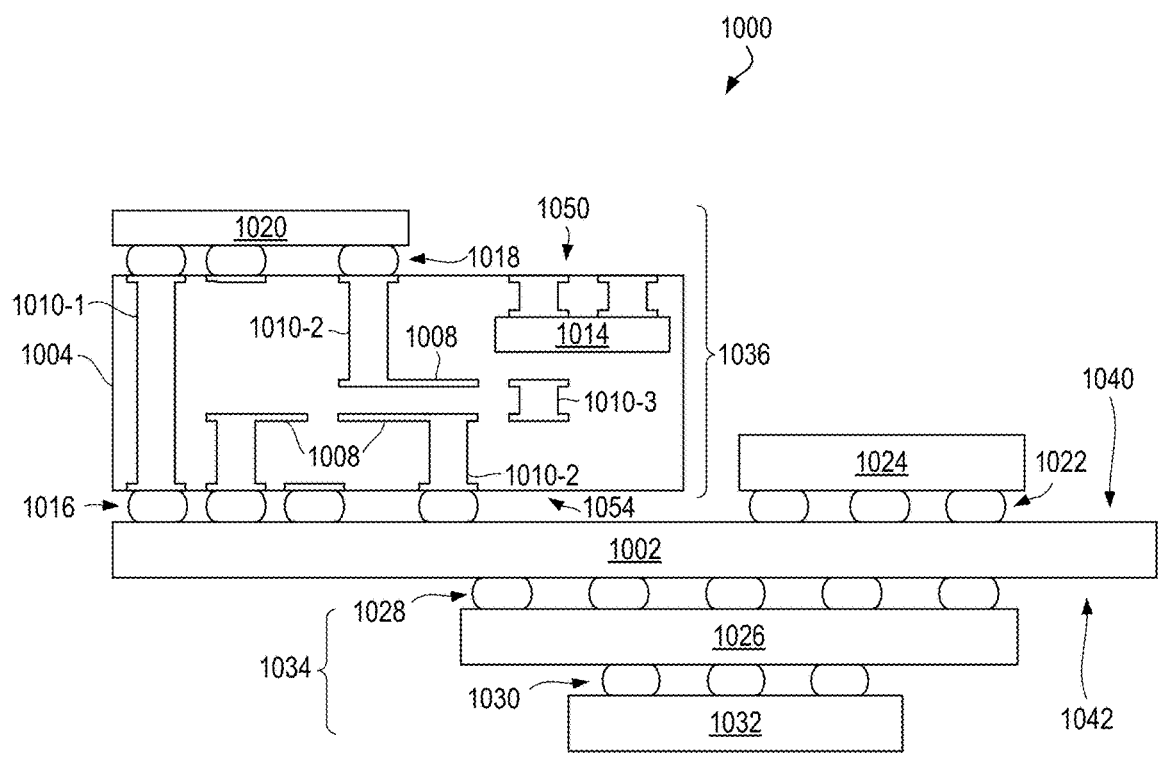
FIG. 10 is a cross-sectional side view of an integrated circuit device assembly, in accordance with any of the embodiments disclosed herein.

FIG. 10 is a cross-sectional side view of an integrated circuit device assembly 1000 that may include any of the systems 200 disclosed herein. In some embodiments, the integrated circuit device assembly 1000 may be a quantum processor 610. The integrated circuit device assembly 1000 includes a number of components disposed on a circuit board 1002 (which may be a motherboard, system board, mainboard, etc.). The integrated circuit device assembly 1000 includes components disposed on a first face 1040 of the circuit board 1002 and an opposing second face 1042 of the circuit board 1002; generally, components may be disposed on one or both faces 1040 and 1042. Any of the integrated circuit components discussed below with reference to the integrated circuit device assembly 1000 may take the form of any suitable ones of the embodiments of the systems 200 disclosed herein.

In some embodiments, the circuit board 1002 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1002. In other embodiments, the circuit board 1002 may be a non-PCB substrate. In some embodiments the circuit board 1002 may be, for example, the circuit board 202. The integrated circuit device assembly 1000 illustrated in FIG. 10 includes a package-on-interposer structure 1036 coupled to the first face 1040 of the circuit board 1002 by coupling components 1016. The coupling components 1016 may electrically and mechanically couple the package-on-interposer structure 1036 to the circuit board 1002, and may include solder balls (as shown in FIG. 10), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1036 may include an integrated circuit component 1020 coupled to an interposer 1004 by coupling components 1018. The coupling components 1018 may take any suitable form for the application, such as the forms discussed above with reference to the coupling components 1016. Although a single integrated circuit component 1020 is shown in FIG. 10, multiple integrated circuit components may be coupled to the interposer 1004; indeed, additional interposers may be coupled to the interposer 1004. The interposer 1004 may provide an intervening substrate used to bridge the circuit board 1002 and the integrated circuit component 1020.

The integrated circuit component 1020 may be a packaged or unpacked integrated circuit product that includes one or more integrated circuit dies (e.g., the die 702 of FIG. 7, the integrated circuit device 800 of FIG. 8) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1020, a single monolithic integrated circuit die comprises solder bumps attached to contacts on the die. The solder bumps allow the die to be directly attached to the interposer 1004. The integrated circuit component 1020 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1020 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1020 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1020 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1004 may spread connections to a wider pitch or reroute a connection to a different connection. For example, the interposer 1004 may couple the integrated circuit component 1020 to a set of ball grid array (BGA) conductive contacts of the coupling components 1016 for coupling to the circuit board 1002. In the embodiment illustrated in FIG. 10, the integrated circuit component 1020 and the circuit board 1002 are attached to opposing sides of the interposer 1004; in other embodiments, the integrated circuit component 1020 and the circuit board 1002 may be attached to a same side of the interposer 1004. In some embodiments, three or more components may be interconnected by way of the interposer 1004.

In some embodiments, the interposer 1004 may be formed as a PCB, including multiple metal layers separated from one another by layers of dielectric material and interconnected by electrically conductive vias. In some embodiments, the interposer 1004 may be formed of an epoxy resin, a fiberglass-reinforced epoxy resin, an epoxy resin with inorganic fillers, a ceramic material, or a polymer material such as polyimide. In some embodiments, the interposer 1004 may be formed of alternate rigid or flexible materials that may include the same materials described above for use in a semiconductor substrate, such as silicon, germanium, and other group III-V and group IV materials. The interposer 1004 may include metal interconnects 1008 and vias 1010, including but not limited to through hole vias 1010-1 (that extend from a first face 1050 of the interposer 1004 to a second face 1054 of the interposer 1004), blind vias 1010-2 (that extend from the first or second faces 1050 or 1054 of the interposer 1004 to an internal metal layer), and buried vias 1010-3 (that connect internal metal layers).

In some embodiments, the interposer 1004 can comprise a silicon interposer. Through silicon vias (TSV) extending through the silicon interposer can connect connections on a first face of a silicon interposer to an opposing second face of the silicon interposer. In some embodiments, an interposer 1004 comprising a silicon interposer can further comprise one or more routing layers to route connections on a first face of the interposer 1004 to an opposing second face of the interposer 1004.

The interposer 1004 may further include embedded devices 1014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1004. The package-on-interposer structure 1036 may take the form of any of the package-on-interposer structures known in the art. In embodiments where the interposer is a non-printed circuit board The integrated circuit device assembly 1000 may include an integrated circuit component 1024 coupled to the first face 1040 of the circuit board 1002 by coupling components 1022. The coupling components 1022 may take the form of any of the embodiments discussed above with reference to the coupling components 1016, and the integrated circuit component 1024 may take the form of any of the embodiments discussed above with reference to the integrated circuit component 1020.

The integrated circuit device assembly 1000 illustrated in FIG. 10 includes a package-on-package structure 1034 coupled to the second face 1042 of the circuit board 1002 by coupling components 1028. The package-on-package structure 1034 may include an integrated circuit component 1026 and an integrated circuit component 1032 coupled together by coupling components 1030 such that the integrated circuit component 1026 is disposed between the circuit board 1002 and the integrated circuit component 1032. The coupling components 1028 and 1030 may take the form of any of the embodiments of the coupling components 1016 discussed above, and the integrated circuit components 1026 and 1032 may take the form of any of the embodiments of the integrated circuit component 1020 discussed above. The package-on-package structure 1034 may be configured in accordance with any of the package-on-package structures known in the art.

Figure 11:
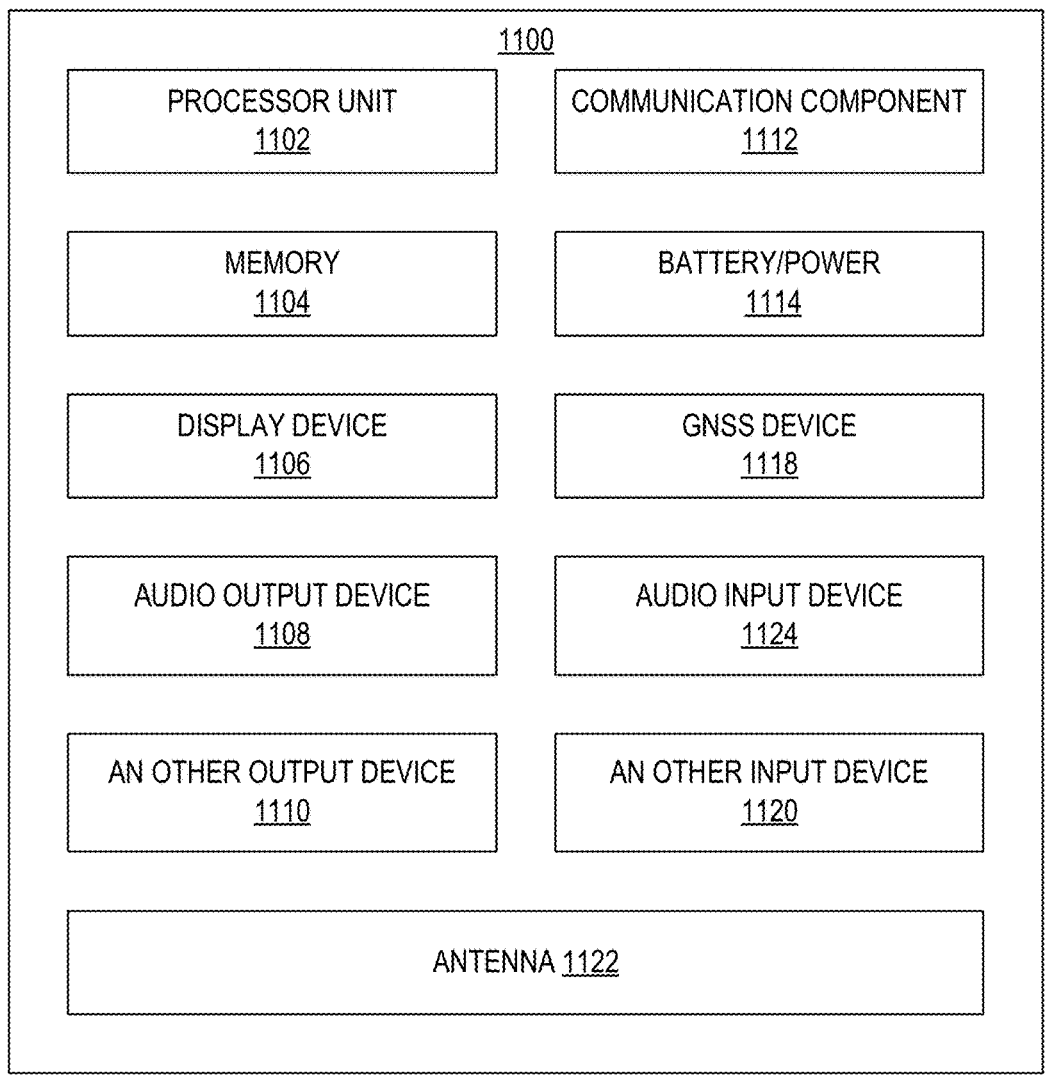
FIG. 11 is a block diagram of an example electrical device, in accordance with any of the embodiments disclosed herein.

FIG. 11 is a block diagram of an example electrical device 1100 that may include one or more of the systems 200 or quantum compute devices 600 disclosed herein. For example, any suitable ones of the components of the electrical device 1100 may include one or more of the integrated circuit device assemblies 1000, integrated circuit components 1020, integrated circuit devices 800, or integrated circuit dies 702 disclosed herein, and may be arranged in any of the quantum compute devices 600 disclosed herein. A number of components are illustrated in FIG. 11 as included in the electrical device 1100, but any one or more of these components may be omitted or duplicated, as suitable for the application. In some embodiments, some or all of the components included in the electrical device 1100 may be attached to one or more motherboards mainboards, or system boards. In some embodiments, one or more of these components are fabricated onto a single system-on-a-chip (SoC) die.

Additionally, in various embodiments, the electrical device 1100 may not include one or more of the components illustrated in FIG. 11, but the electrical device 1100 may include interface circuitry for coupling to the one or more components. For example, the electrical device 1100 may not include a display device 1106, but may include display device interface circuitry (e.g., a connector and driver circuitry) to which a display device 1106 may be coupled. In another set of examples, the electrical device 1100 may not include an audio input device 1124 or an audio output device 1108, but may include audio input or output device interface circuitry (e.g., connectors and supporting circuitry) to which an audio input device 1124 or audio output device 1108 may be coupled.

The electrical device 1100 may include one or more processor units 1102 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1102 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1100 may include a memory 1104, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1104 may include memory that is located on the same integrated circuit die as the processor unit 1102. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1100 can comprise one or more processor units 1102 that are heterogeneous or asymmetric to another processor unit 1102 in the electrical device 1100. There can be a variety of differences between the processing units 1102 in a system in terms of a spectrum of metrics of merit including architectural, micro-architectural, thermal, power consumption characteristics, and the like. These differences can effectively manifest themselves as asymmetry and heterogeneity among the processor units 1102 in the electrical device 1100.

In some embodiments, the electrical device 1100 may include a communication component 1112 (e.g., one or more communication components). For example, the communication component 1112 can manage wireless communications for the transfer of data to and from the electrical device 1100. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1112 may operate in accordance with other wireless protocols in other embodiments. The electrical device 1100 may include an antenna 1122 to facilitate wireless communications and/or to receive other wireless communications (such as AM or FM radio transmissions).

In some embodiments, the communication component 1112 may manage wired communications, such as electrical, optical, or any other suitable communication protocols (e.g., IEEE 802.3 Ethernet standards). As noted above, the communication component 1112 may include multiple communication components. For instance, a first communication component 1112 may be dedicated to shorter-range wireless communications such as Wi-Fi or Bluetooth, and a second communication component 1112 may be dedicated to longer-range wireless communications such as global positioning system (GPS), EDGE, GPRS, CDMA, WiMAX, LTE, EV-DO, or others. In some embodiments, a first communication component 1112 may be dedicated to wireless communications, and a second communication component 1112 may be dedicated to wired communications.

The electrical device 1100 may include battery/power circuitry 1114. The battery/power circuitry 1114 may include one or more energy storage devices (e.g., batteries or capacitors) and/or circuitry for coupling components of the electrical device 1100 to an energy source separate from the electrical device 1100 (e.g., AC line power).

The electrical device 1100 may include a display device 1106 (or corresponding interface circuitry, as discussed above). The display device 1106 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1100 may include an audio output device 1108 (or corresponding interface circuitry, as discussed above). The audio output device 1108 may include any embedded or wired or wirelessly connected external device that generates an audible indicator, such speakers, headsets, or earbuds.

The electrical device 1100 may include an audio input device 1124 (or corresponding interface circuitry, as discussed above). The audio input device 1124 may include any embedded or wired or wirelessly connected device that generates a signal representative of a sound, such as microphones, microphone arrays, or digital instruments (e.g., instruments having a musical instrument digital interface (MIDI) output). The electrical device 1100 may include a Global Navigation Satellite System (GNSS) device 1118 (or corresponding interface circuitry, as discussed above), such as a Global Positioning System (GPS) device. The GNSS device 1118 may be in communication with a satellite-based system and may determine a geolocation of the electrical device 1100 based on information received from one or more GNSS satellites, as known in the art.

The electrical device 1100 may include another output device 1110 (or corresponding interface circuitry, as discussed above). Examples of the other output device 1110 may include an audio codec, a video codec, a printer, a wired or wireless transmitter for providing information to other devices, or an additional storage device.

The electrical device 1100 may include another input device 1120 (or corresponding interface circuitry, as discussed above). Examples of the other input device 1120 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1100 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1100 may be any other electronic device that processes data. In some embodiments, the electrical device 1100 may comprise multiple discrete physical components. Given the range of devices that the electrical device 1100 can be manifested as in various embodiments, in some embodiments, the electrical device 1100 can be referred to as a computing device or a computing system.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

EXAMPLES

Illustrative examples of the technologies disclosed herein are provided below. An embodiment of the technologies may include any one or more, and any combination of, the examples described below.

Example 1 includes a quantum processor die comprising a plurality of spin qubits; a plurality of coplanar waveguides on a surface of the quantum processor die to deliver signals to and from the plurality of spin qubits, wherein individual coplanar waveguides of the plurality of coplanar waveguides comprise a center signal conductor and two ground conductors; and a ground ring surrounding the plurality of coplanar waveguides, wherein the two ground conductors of individual coplanar waveguides of the plurality of coplanar waveguides are connected to the ground ring.

Example 2 includes the subject matter of Example 1, and wherein individual coplanar waveguides of the plurality of coplanar waveguides comprise a plurality of ground straps, wherein individual ground straps of the plurality of ground straps of individual coplanar waveguides of the plurality of coplanar waveguides connect the two ground conductors of the corresponding coplanar waveguide together and are below the surface of the quantum processor die.

Example 3 includes the subject matter of any of Examples 1 and 2, and wherein the quantum processor die comprises a carrier substrate, wherein the carrier substrate comprises low-doped silicon.

Example 4 includes the subject matter of any of Examples 1-3, and wherein the ground conductors of the plurality of coplanar waveguides form a mesh on the surface of the quantum processor die.

Example 5 includes a system comprising the quantum processor die of claim 1, the system further comprising a circuit board, wherein the quantum processor die is mounted on the circuit board; and a plurality of wire bonds, wherein individual wire bonds of the plurality of wire bonds connect the ground ring to a ground of the circuit board.

Example 6 includes the subject matter of Example 5, and wherein the circuit board and the quantum processor die are at a temperature below 100 millikelvin, wherein individual wire bonds of the plurality of wire bonds conduct heat from the quantum processor die to the circuit board to cool the quantum processor die.

Example 7 includes a system comprising the quantum processor die of claim 1, the system further comprising a circuit board; and a nonconductive isolation layer mounted on the circuit board, wherein the quantum processor die is mounted on the nonconductive isolation layer.

Example 8 includes a system comprising the quantum processor die of claim 1, the system further comprising a circuit board, wherein the quantum processor die is mounted on the circuit board; an impedance matching network chip; and a plurality of wire bonds, wherein individual wire bonds of the plurality of wire bonds connect one of a plurality of signal pads of the quantum processor die to one of a plurality of signal pads on the impedance matching network chip.

Example 9 includes a system comprising the quantum processor die of claim 1, the system further comprising a circuit board, wherein the quantum processor die is mounted on the circuit board; a plurality of signal traces on a surface of the circuit board; and a plurality of wire bonds, wherein individual wire bonds of the plurality of wire bonds connect one of the plurality of signal traces to a signal pad of a plurality of signal pads of the quantum processor die.

Example 10 includes a quantum compute device comprising the quantum processor die of claim 1, further comprising a processor; a memory communicatively coupled to the processor; and quantum/classical interface circuitry communicatively coupled to the processor and the quantum processor die.

Example 11 includes a quantum processor die comprising a plurality of spin qubits; and a plurality of coplanar waveguides on a surface of the quantum processor die to deliver signals to and from the plurality of spin qubits, wherein individual coplanar waveguides of the plurality of coplanar waveguides comprise a center signal conductor and two ground conductors, wherein each signal line on the surface of the quantum processor die is a coplanar waveguides of the plurality of coplanar waveguides.

Example 12 includes the subject matter of Example 11, and further including a ground ring surrounding the plurality of coplanar waveguides, wherein the two ground conductors of individual coplanar waveguides of the plurality of coplanar waveguides are connected to the ground ring.

Example 13 includes a system comprising the quantum processor die of claim 12, the system further comprising a circuit board, wherein the quantum processor die is mounted on the circuit board; and a plurality of wire bonds, wherein individual wire bonds of the plurality of wire bonds connect the ground ring to a ground of the circuit board.

Example 14 includes the subject matter of Example 13, and wherein the circuit board and the quantum processor die are at a temperature below 100 millikelvin, wherein individual wire bonds of the plurality of wire bonds conduct heat from the quantum processor die to the circuit board to cool the quantum processor die.

Example 15 includes the subject matter of any of Examples 13 and 14, and wherein individual coplanar waveguides of the plurality of coplanar waveguides comprise a plurality of ground straps, wherein individual ground straps of the plurality of ground straps of individual coplanar waveguides of the plurality of coplanar waveguides connect the two ground conductors of the corresponding coplanar waveguide together and are below the surface of the quantum processor die.

Example 16 includes the subject matter of any of Examples 13-15, and wherein the quantum processor die comprises a carrier substrate, wherein the carrier substrate comprises low-doped silicon.

Example 17 includes the subject matter of any of Examples 13-16, and wherein the ground conductors of the plurality of coplanar waveguides form a mesh on the surface of the quantum processor die.

Example 18 includes a system comprising the quantum processor die of claim 11, the system further comprising a circuit board; and a nonconductive isolation layer mounted on the circuit board, wherein the quantum processor die is mounted on the nonconductive isolation layer.

Example 19 includes a system comprising the quantum processor die of claim 11, the system further comprising a circuit board, wherein the quantum processor die is mounted on the circuit board; an impedance matching network chip; and a plurality of wire bonds, wherein individual wire bonds of the plurality of wire bonds connect one of a plurality of signal pads of the quantum processor die to one of a plurality of signal pads on the impedance matching network chip.

Example 20 includes a system comprising the quantum processor die of claim 11, the system further comprising a circuit board, wherein the quantum processor die is mounted on the circuit board; a plurality of signal traces on a surface of the circuit board; and a plurality of wire bonds, wherein individual wire bonds of the plurality of wire bonds connect one of the plurality of signal traces to a signal pad of a plurality of signal pads of the quantum processor die.

Example 21 includes a quantum compute device comprising the quantum processor die of claim 11, further comprising a processor; a memory communicatively coupled to the processor; and quantum/classical interface circuitry communicatively coupled to the processor and the quantum processor die.

Example 22 includes a method for fabricating a plurality of quantum processor dies, the method comprising applying a first dielectric layer to a carrier substrate wafer, wherein the carrier substrate wafer has a diameter over 250 millimeters, wherein the carrier substrate wafer comprises low-doped silicon; applying a silicon layer over the first dielectric layer; fabricating a plurality of spin qubit arrays in the silicon layer, wherein individual spin qubit arrays of the plurality of spin qubit arrays correspond to a quantum processor die of the plurality of quantum processor dies; applying a second dielectric layer over the silicon layer; patterning a plurality of coplanar waveguides on a surface of the second dielectric layer to deliver signals to and from the plurality of spin qubit arrays, wherein individual coplanar waveguides of the plurality of coplanar waveguides comprise a center signal conductor and two ground conductors; patterning a plurality of ground rings, wherein individual ground rings of the plurality of ground rings correspond to a quantum processor die of the plurality of quantum processor dies, and wherein individual ground rings of the plurality of ground rings surround coplanar waveguides of the plurality of coplanar waveguides corresponding to the corresponding quantum processor die of the plurality of quantum processor dies; and singulating the carrier substrate wafer into the plurality of quantum processor dies.

Example 23 includes the subject matter of Example 22, and wherein applying the second dielectric layer over the silicon layer comprises patterning a plurality of ground straps, wherein individual ground straps of the plurality of ground straps connect the two ground conductors of individual coplanar waveguides of the plurality of coplanar waveguides together after patterning of the plurality of coplanar waveguides.

Example 24 includes the subject matter of any of Examples 22 and 23, and wherein the ground conductors of the plurality of coplanar waveguides form a mesh on the surface of the second dielectric layer.

Example 25 includes the subject matter of any of Examples 22-24, and further including mounting a quantum processor die of the plurality of quantum processor dies on a circuit board, wherein the quantum processor die comprises a ground ring of the plurality of ground rings; and applying a plurality of wire bonds to connect the ground ring of the quantum processor die to a ground of the circuit board.

Example 26 includes the subject matter of any of Examples 22-25, and further including cooling the circuit board and the quantum processor die to a temperature below 100 millikelvin; and cooling the quantum processor die by conducting heat through individual wire bonds of the plurality of wire bonds from the quantum processor die to the circuit board.

Example 27 includes the subject matter of any of Examples 22-26, and further including mounting a nonconductive isolation layer on a circuit board; and mounting a quantum processor die of the plurality of quantum processor dies on the nonconductive isolation layer.

Example 28 includes the subject matter of any of Examples 22-27, and further including mounting a quantum processor die of the plurality of quantum processor dies on a circuit board; mounting an impedance matching network chip on the circuit board; and applying a plurality of wire bonds, wherein individual wire bonds of the plurality of wire bonds connect one of a plurality of signal pads of the quantum processor die to one of a plurality of signal pads on the impedance matching network chip.

Example 29 includes the subject matter of any of Examples 22-28, and further including mounting a quantum processor die of the plurality of quantum processor dies on a circuit board, wherein the circuit board comprises a plurality of signal traces on a surface of the circuit board; and applying a plurality of wire bonds, wherein individual wire bonds of the plurality of wire bonds connect one of the plurality of signal traces to a signal pad of a plurality of signal pads of the quantum processor die.

Example 30 includes the subject matter of any of Examples 22-29, and further including mounting a quantum processor die of the plurality of quantum processor dies on a circuit board; connecting quantum/classical interface circuitry to the quantum processor die; and connecting a processor to the quantum/classical interface circuitry.

The invention claimed is:

1. A quantum processor die comprising:
   a plurality of spin qubits;
   a plurality of waveguides on a surface of the quantum processor die to deliver signals to and from the plurality of spin qubits, wherein individual waveguides of the plurality of waveguides comprise a center signal conductor and two ground conductors; and
   a metallic structure surrounding, without gaps, the plurality of waveguides, wherein the two ground conductors of individual waveguides of the plurality of waveguides are connected to the metallic structure.

2. The quantum processor die of claim 1, wherein individual waveguides of the plurality of waveguides comprise a plurality of ground straps, wherein individual ground straps of the plurality of ground straps of individual waveguides of the plurality of waveguides connect the two ground conductors of the corresponding waveguide together and are below the surface of the quantum processor die.

3. The quantum processor die of claim 1, wherein the quantum processor die comprises a carrier substrate, wherein the carrier substrate comprises low-doped silicon.

4. The quantum processor die of claim 1, wherein the ground conductors of the plurality of waveguides form a mesh on the surface of the quantum processor die.

5. A system comprising the quantum processor die of claim 1, wherein the metallic structure is a ground ring, the system further comprising:
a circuit board, wherein the quantum processor die is mounted on the circuit board; and
a plurality of wire bonds, wherein individual wire bonds of the plurality of wire bonds connect the ground ring to the ground of the circuit board.

6. The system of claim 5, wherein the circuit board and the quantum processor die are at a temperature below 100 millikelvin,
wherein individual wire bonds of the plurality of wire bonds conduct heat from the quantum processor die to the circuit board to cool the quantum processor die.

7. A system comprising the quantum processor die of claim 1, the system further comprising:
a circuit board; and
a nonconductive isolation layer mounted on the circuit board, wherein the quantum processor die is mounted on the nonconductive isolation layer.

8. A system comprising the quantum processor die of claim 1, the system further comprising:
a circuit board, wherein the quantum processor die is mounted on the circuit board;
an impedance matching network chip; and
a plurality of wire bonds, wherein individual wire bonds of the plurality of wire bonds connect one of a plurality of signal pads of the quantum processor die to one of a plurality of signal pads on the impedance matching network chip.

9. A system comprising the quantum processor die of claim 1, the system further comprising:
a circuit board, wherein the quantum processor die is mounted on the circuit board;
a plurality of signal traces on a surface of the circuit board; and
a plurality of wire bonds, wherein individual wire bonds of the plurality of wire bonds connect one of the plurality of signal traces to a signal pad of a plurality of signal pads of the quantum processor die.

10. A quantum compute device comprising the quantum processor die of claim 1, further comprising:
a processor;
a memory communicatively coupled to the processor; and
quantum/classical interface circuitry communicatively coupled to the processor and the quantum processor die.

11. A quantum processor die comprising:
a plurality of spin qubits; and
a plurality of waveguides on a surface of the quantum processor die to deliver signals to and from the plurality of spin qubits,
wherein individual waveguides of the plurality of waveguides comprise a center signal conductor and two ground conductors,
wherein each signal conductor on the surface of the quantum processor die is a signal conductor of one of the plurality of waveguides.

12. The quantum processor die of claim 11, further comprising:
a ground ring surrounding the plurality of waveguides, wherein the two ground conductors of individual waveguides of the plurality of waveguides are connected to the ground ring.

13. A system comprising the quantum processor die of claim 12, the system further comprising:
a circuit board, wherein the quantum processor die is mounted on the circuit board; and
a plurality of wire bonds, wherein individual wire bonds of the plurality of wire bonds connect the ground ring to a ground of the circuit board.

14. The system of claim 13, wherein the circuit board and the quantum processor die are at a temperature below 100 millikelvin,
wherein individual wire bonds of the plurality of wire bonds conduct heat from the quantum processor die to the circuit board to cool the quantum processor die.

15. The quantum processor die of claim 11, wherein individual waveguides of the plurality of waveguides comprise a plurality of ground straps, wherein individual ground straps of the plurality of ground straps of individual waveguides of the plurality of waveguides connect the two ground conductors of the corresponding waveguide together and are below the surface of the quantum processor die.

16. The quantum processor die of claim 11, wherein the quantum processor die comprises a carrier substrate, wherein the carrier substrate comprises low-doped silicon.

17. A system comprising the quantum processor die of claim 11, the system further comprising:
a circuit board, wherein the quantum processor die is mounted on the circuit board;
an impedance matching network chip; and
a plurality of wire bonds, wherein individual wire bonds of the plurality of wire bonds connect one of a plurality of signal pads of the quantum processor die to one of a plurality of signal pads on the impedance matching network chip.

18. A method for fabricating a plurality of quantum processor dies, the method comprising:
applying a first dielectric layer to a carrier substrate wafer, wherein the carrier substrate wafer has a diameter over 250 millimeters, wherein the carrier substrate wafer comprises low-doped silicon;
applying a silicon layer over the first dielectric layer;
fabricating a plurality of spin qubit arrays in the silicon layer, wherein individual spin qubit arrays of the plurality of spin qubit arrays correspond to a quantum processor die of the plurality of quantum processor dies;
applying a second dielectric layer over the silicon layer;
patterning a plurality of waveguides on a surface of the second dielectric layer to deliver signals to and from the plurality of spin qubit arrays, wherein individual waveguides of the plurality of waveguides comprise a center signal conductor and two ground conductors;
patterning a plurality of ground rings, wherein individual ground rings of the plurality of ground rings correspond to a quantum processor die of the plurality of quantum processor dies, and wherein individual ground rings of the plurality of ground rings surround waveguides of the plurality of waveguides corresponding to the corresponding quantum processor die of the plurality of quantum processor dies; and
singulating the carrier substrate wafer into the plurality of quantum processor dies.

19. The method of claim 18, wherein applying the second dielectric layer over the silicon layer comprises patterning a plurality of ground straps, wherein individual ground straps of the plurality of ground straps connect the two ground conductors of individual waveguides of the plurality of waveguides together after patterning of the plurality of waveguides.

20. The method of claim 18, wherein the ground conductors of the plurality of waveguides form a mesh on the surface of the second dielectric layer.

21. The method of claim 18, further comprising:
mounting a quantum processor die of the plurality of quantum processor dies on a circuit board, wherein the quantum processor die comprises a ground ring of the plurality of ground rings; and
applying a plurality of wire bonds to connect the ground ring of the quantum processor die to a ground of the circuit board.

22. The quantum processor die of claim 11, wherein the ground conductors of the plurality of waveguides form a mesh on the surface of the quantum processor die.

23. A system comprising the quantum processor die of claim 11, the system further comprising:
a circuit board; and
a nonconductive isolation layer mounted on the circuit board, wherein the quantum processor die is mounted on the nonconductive isolation layer.

24. A system comprising the quantum processor die of claim 11, the system further comprising:
a circuit board, wherein the quantum processor die is mounted on the circuit board;
a plurality of signal traces on a surface of the circuit board; and
a plurality of wire bonds, wherein individual wire bonds of the plurality of wire bonds connect one of the plurality of signal traces to a signal pad of a plurality of signal pads of the quantum processor die.

25. A quantum compute device comprising the quantum processor die of claim 11, further comprising:
a processor;
a memory communicatively coupled to the processor; and
quantum/classical interface circuitry communicatively coupled to the processor and the quantum processor die.

* * * * *